(12) United States Patent
Kawai

(10) Patent No.: US 12,195,636 B2
(45) Date of Patent: Jan. 14, 2025

(54) RESIN COMPOSITION, CURED PRODUCT, SHEET LAMINATION MATERIAL, RESIN SHEET, PRINTED WIRING BOARD, AND SEMICONDUCTOR DEVICE, AND METHOD FOR PRODUCING PRINTED WIRING BOARD

(71) Applicant: AJINOMOTO CO., INC., Tokyo (JP)

(72) Inventor: Kenji Kawai, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 251 days.

(21) Appl. No.: 17/501,127

(22) Filed: Oct. 14, 2021

(65) Prior Publication Data

US 2022/0119670 A1 Apr. 21, 2022

(30) Foreign Application Priority Data

Oct. 15, 2020 (JP) .................. 2020-174131

(51) Int. Cl.
| | |
|---|---|
| *C09D 163/00* | (2006.01) |
| *C08G 73/10* | (2006.01) |
| *C08L 63/00* | (2006.01) |
| *H05K 1/03* | (2006.01) |

(52) U.S. Cl.
CPC ....... *C09D 163/00* (2013.01); *C08G 73/1007* (2013.01); *C08G 73/1042* (2013.01); *C08G 73/1046* (2013.01); *C08G 73/1071* (2013.01); *C08G 73/1082* (2013.01); *C08L 63/00* (2013.01); *C08L 2203/20* (2013.01); *H05K 1/0346* (2013.01)

(58) Field of Classification Search
CPC ............ C08G 73/1007; C08G 73/1042; C08G 73/1071; C08G 73/1082; C08G 73/1046–1085; C08L 79/08; C08L 63/00–10; C09D 163/00; H05K 1/0353; H05K 2201/0154
See application file for complete search history.

(56) References Cited

U.S. PATENT DOCUMENTS

2005/0119381 A1* 6/2005 Tanaka ................ C08L 79/08
524/196

FOREIGN PATENT DOCUMENTS

| JP | 2010-53223 A | 3/2010 |
|---|---|---|
| JP | 2019-014827 | 1/2019 |
| WO | WO 03/076515 A1 | 9/2003 |

OTHER PUBLICATIONS

Japanese Office Action issued Nov. 21, 2023 in Japanese Application 2020-174131, (with unedited computer-generated English translation), 5 pages.
Japanese Office Action issued Mar. 12, 2024 in Japanese Patent Application No. 2020-174131, 2 pages.

* cited by examiner

*Primary Examiner* — Ana L. Woodward
(74) *Attorney, Agent, or Firm* — Oblon, McClelland, Maier & Neustadt, L.L.P.

(57) ABSTRACT

Resin composition including an epoxy resin, an epoxy resin curing agent, and a polyimide resin including a specified structural unit provide a high yield after patterning.

32 Claims, No Drawings

RESIN COMPOSITION, CURED PRODUCT, SHEET LAMINATION MATERIAL, RESIN SHEET, PRINTED WIRING BOARD, AND SEMICONDUCTOR DEVICE, AND METHOD FOR PRODUCING PRINTED WIRING BOARD

CROSS REFERENCES TO RELATED APPLICATIONS

This application claims priority to Japanese Patent Application No. 2020-174131, filed on Oct. 15, 2020, which is incorporated herein by reference in its entirety.

BACKGROUND OF THE INVENTION

Field of the Invention

The present invention relates to resin compositions. The present invention further relates to cured products, sheet lamination materials, resin sheets, printed wiring boards, and semiconductor devices, and methods for producing printed wiring boards or semiconductor devices, all being obtained by using such a resin composition.

Discussion of the Background

In Japanese Patent Application Laid-open No. 2019-014827, which is incorporated herein by reference in its entirety, a polyimide is disclosed. The polyimide film formed of the polyimide such as the one disclosed therein is used, for example, as a coverlay film by having an adhesive layer attached to it (see paragraph [0063] of Japanese Patent Application Laid-open No. 2019-014827, which is incorporated herein by reference in its entirety).

SUMMARY OF THE INVENTION

A curable resin material to be used in the insulating layer of a printed wiring board is required to have a high yield after patterning.

Accordingly, it is one object of the present invention to provide novel resin compositions having a high yield after patterning.

It is another object of the present invention to provide novel cured products, sheet lamination materials, resin sheets, printed wiring boards, and semiconductor devices, and methods for producing printed wiring boards or semiconductor devices, all of these being obtained by using such a resin composition.

These and other objects, which will become apparent during the following detailed description, have been achieved by the inventor's discovery that these objects can be achieved by using a resin composition having the composition described below.

Specifically, the present invention includes the following embodiments.

(1) A resin composition comprising:

(A) at least one epoxy resin;

(B) at least one epoxy curing agent; and (C) at least one polyimide resin comprising a structural unit represented by the following formula (c1):

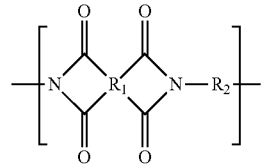

wherein in the formula (c1), $R_1$ represents a tetravalent group represented by the following formula (c1-1), and $R_2$ represents a divalent group represented by the following formula (c1-2)

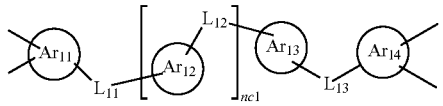

wherein in the formula (c1-1), $Ar_{11}$, $Ar_{12}$, $Ar_{13}$, and $Ar_{14}$ each independently represent an optionally substituted aromatic ring, $L_{11}$, $L_{12}$, and $L_{13}$ each independently represent a divalent connecting group, and nc1 represents an integer of 0 or more);

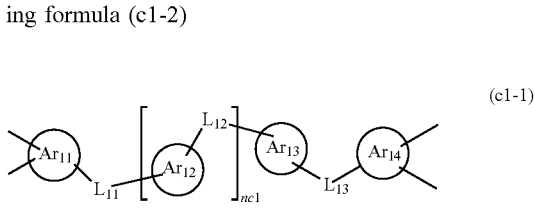

wherein in the formula (c1-2), $Ar_{21}$, $Ar_{22}$, $Ar_{23}$, and $Ar_{24}$ each independently represent an optionally substituted aromatic ring, $L_{21}$, $L_{22}$, and $L_{23}$ each independently represent a divalent connecting group, and nc2 represents an integer of 1 or more.

(2) The resin composition according to (1), wherein in the formula (c1-1), $Ar_{11}$, $Ar_{12}$, $Ar_{13}$, and $Ar_{14}$ each independently represent an optionally substituted aromatic carbon ring having 6 to 14 carbon atoms, and in the formula (c1-2), $Ar_{21}$, $Ar_{22}$, $Ar_{23}$, and $Ar_{24}$ each independently represent an optionally substituted aromatic carbon ring having 6 to 14 carbon atoms.

(3) The resin composition according to (1) or (2), wherein in the formula (c1-1), $L_{11}$ and $L_{13}$ represent —O—, and $L_{12}$ represents an optionally substituted alkylene group, and in the formula (c1-2), $L_{21}$ and $L_{23}$ represent —O—, and $L_{22}$ represents an optionally substituted alkylene group.

(4) The resin composition according to any one of (1) to (3), wherein the component (C) is a resin further comprising a structural unit represented by the following formula (c2):

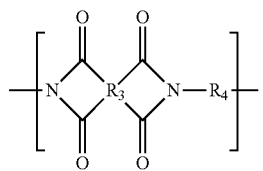

wherein in the formula (c2),
R$_3$ represents an optionally substituted tetravalent aliphatic group or an optionally substituted tetravalent aromatic group, and
R$_4$ represents an optionally substituted divalent aliphatic group or an optionally substituted divalent aromatic group; when R$_3$ is same as R$_1$, R$_4$ is different from R$_2$, and when R$_4$ is same as R$_2$, R$_3$ is different from R$_1$.

(5) The resin composition according to (4), wherein R$_4$ is an optionally substituted divalent aliphatic group, and one of the substituent groups thereof is an alkyl group having 1 to 6 carbon atoms.

(6) The resin composition according to (4) or (5), wherein R$_4$ is an optionally substituted divalent aliphatic group, the divalent aliphatic group being obtainable from isophoronediamine by removal of two amino groups thereof.

(7) The resin composition according to any one of (4) to (6), wherein R$_3$ is same as R$_1$.

(8) The resin composition according to any one of (1) to (7), wherein the component (C) is present in an amount of 0.01 to 30% by mass relative to 100% by mass of nonvolatile components in the resin composition.

(9) A resin composition comprising:
(A) at least one epoxy resin;
(B) at least one epoxy curing agent; and
(C') at least one polyimide resin, wherein
the component (C') is a resin comprising a first skeleton derived from 2,2-bis[4-(3,4-dicarboxyphenoxy)phenyl]propane dianhydride and a second skeleton derived from 4,4'-[1,4-phenylenebis[(1-methylethylidene)-4,1-phenyleneoxy]]bisbenzeneamine.

(10) The resin composition according to (9), wherein the component (C') is a resin further comprising a third skeleton that is different from the second skeleton, and the third skeleton is a skeleton derived from one or more diamine compounds selected from the group consisting of diamine compounds having an optionally substituted aliphatic group and diamine compounds having an optionally substituted aromatic group.

(11) The resin composition according to (10), wherein the third skeleton is a skeleton derived from a diamine compound having an aliphatic group having, as a substituent group thereof, an alkyl group having 1 to 6 carbon atoms.

(12) The resin composition according to any one of (9) to (11), wherein the component (C') is a resin further comprising a skeleton derived from isophoronediamine.

(13) The resin composition according to any one of (9) to (12), wherein the component (C') is present in an amount of 0.01 to 30% by mass relative to 100% by mass of nonvolatile components in the resin composition.

(14) A resin composition comprising:
(A) at least one epoxy resin;
(B) at least one epoxy curing agent; and
(C") at least one polyimide resin, wherein
the component (C") is a resin obtained by polymerizing and imidizing a monomer composition comprising at least 2,2-bis[4-(3,4-dicarboxyphenoxy)phenyl]propane dianhydride and 4,4'-[1,4-phenylenebis[(1-methylethylidene)-4,1-phenyleneoxy]]bisbenzeneamine.

(15) The resin composition according to (14), wherein the monomer composition further comprises one or more diamine compounds selected from the group consisting of diamine compounds having an optionally substituted aliphatic group and diamine compounds having an optionally substituted aromatic group.

(16) The resin composition according to (14) or (15), wherein the monomer composition further comprises a diamine compound having an aliphatic group having, as a substituent group thereof, an alkyl group having 1 to 6 carbon atoms.

(17) The resin composition according to any one of (14) to (16), wherein the monomer composition further comprises isophoronediamine.

(18) The resin composition according to any one of (14) to (17), wherein the component (C") is present in an amount of 0.01 to 30% by mass relative to 100% by mass of nonvolatile components in the resin composition.

(19) The resin composition according to any one of (1) to (18), wherein the component (B) comprises (B-1) an active ester compound.

(20) The resin composition according to any one of (1) to (19), further comprising (D) an inorganic filler.

(21) The resin composition according to (20), wherein the component (D) is present in an amount of 40% or more by mass relative to 100% by mass of nonvolatile components in the resin composition.

(22) The resin composition according to any one of (1) to (21), wherein a cured product thereof has a glass transition temperature of 140° C. or higher.

(23) The resin composition according to any one of (1) to (22), wherein a cured product thereof has a dielectric loss tangent of less than 0.003.

(24) The resin composition according to any one of (1) to (23), wherein a cured product thereof has a dielectric constant of 3.0 or more.

(25) A cured product of a resin composition according to any one of (1) to (24).

(26) A sheet lamination material, comprising a resin composition according to any one of (1) to (24).

(27) A resin sheet comprising:
a supporting body; and
a resin composition layer formed on the supporting body, the resin composition layer being formed of a resin composition according to any one of (1) to (24).

(28) A printed wiring board, comprising an insulating layer formed of a cured product of a resin composition according to any one of (1) to (24).

(29) A semiconductor device, comprising a printed wiring board according to (28).

(30) A method for producing a printed wiring board, comprising a step of forming an insulating layer of the printed wiring board by using a resin composition according to any one of (1) to (24).

Effect of Invention

According to the present invention, provided are: a novel resin composition having a high yield after patterning; and a cured product, a sheet lamination material, a resin sheet, a printed wiring board, and a semiconductor device, methods for producing printed wiring boards or semiconductor devices, all of these being obtained by using this resin composition.

DETAILED DESCRIPTION OF THE INVENTION

Hereinafter, the present invention will be explained in detail in accordance with the preferred embodiments thereof. Note that the present invention is not limited to the embodiments and examples described hereinafter, so that the present invention can be carried out with an arbitrary modification as far as such a modification does not deviate from the claims and the equivalent thereof.

Resin Composition:

The resin composition according to the present invention is characterized by including (A) an epoxy resin, (B) an epoxy curing agent, and also (C) a first specified polyimide resin, (C') a second specified polyimide resin, or (C'') a third specified polyimide resin. The first to third polyimide resins will be describe later.

In the epoxy system, the resin composition according to the present invention including the component (C), the component (C'), or the component (C'') (hereinafter, these compositions are also called "the resin composition according to a first embodiment", "the resin composition according to a second embodiment", or "the resin composition according to a third embodiment", respectively; and these are also collectively called "the resin composition according to the present invention") can give a cured product with a high yield after patterning. In addition, the cured product of the resin composition according to the present invention has a tendency to have excellent characteristics in dielectric characteristics, heat resistance, and the like. Also, the cured product of the resin composition according to the present invention has a tendency to have low roughness and excellent adhesion to plating (hereinafter, this is also called "plating adhesion"). Accordingly, the resin composition according to the present invention can realize to provide the cured product (insulating layer) having excellent characteristics, so that this can significantly contribute to today's requirements of high functionalities in a printed wiring board and a semiconductor device.

Resin Composition According to the First Embodiment

The resin composition according to the first embodiment of the present invention is characterized by including (A) an epoxy resin, (B) an epoxy curing agent, and (C) a first specified polyimide resin.

(A) Epoxy Resin

The resin composition according to the present invention includes the epoxy resin as the component (A). The epoxy resin may be used singly or as a combination of two or more of these resins.

Illustrative examples of (A) the epoxy resin include a bixylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolak type epoxy resin, a phenol novolak type epoxy resin, a tert-butyl-catechol type epoxy resin, a naphthalene type epoxy resin, a naphthol type epoxy resin, an anthracene type epoxy resin, a glycidylamine type epoxy resin, a glycidyl ester type epoxy resin, a cresol novolak type epoxy resin, a phenolaralkyl type epoxy resin, a biphenyl type epoxy resin, a linear aliphatic epoxy resin, an epoxy resin having a butadiene structure, an alicyclic epoxy resin, a heterocyclic epoxy resin, an epoxy resin having a spiro ring, a cyclohexane type epoxy resin, a cyclohexane dimethanol type epoxy resin, a naphthylene ether type epoxy resin, a trimethylol type epoxy resin, a tetraphenylethane type epoxy resin, an isocyanurate type epoxy resin, a phenolphthalimidine type epoxy resin, and a phenolphthalein type epoxy resin.

In the resin composition, (A) the epoxy resin having 2 or more epoxy groups in one molecule thereof is preferable. A ratio of the epoxy resin having 2 or more epoxy groups in one molecule thereof relative to 100% by mass of nonvolatile components in (A) the epoxy resin is preferably 50% or more by mass, and more preferably 60% or more by mass, while especially preferably 70% or more by mass.

In the epoxy resin, there are an epoxy resin that is in the state of liquid at 20° C. (hereinafter, this is also called "liquid epoxy resin") and an epoxy resin that is in the state of solid at 20° C. (hereinafter, this is also called "solid epoxy resin"). The resin composition according to the present invention may include, as the epoxy resin, only the liquid epoxy resin, or only the solid epoxy resin, or a combination of the liquid epoxy resin and the solid epoxy resin. The component (A) is preferably the liquid epoxy resin, or a combination of the liquid epoxy resin and the solid epoxy resin, while more preferably the liquid epoxy resin.

As for the liquid epoxy resin, the liquid epoxy resin having two or more epoxy groups in one molecule thereof is preferable.

The liquid epoxy resin is preferably a bisphenol A type epoxy resin, a bisphenol F type epoxy resin, a bisphenol AF type epoxy resin, a naphthalene type epoxy resin, a glycidyl ester type epoxy resin, a glycidylamine type epoxy resin, a phenol novolak type epoxy resin, an alicyclic epoxy resin having an ester skeleton, a cyclohexane type epoxy resin, a cyclohexane dimethanol type epoxy resin, and an epoxy resin having a butadiene structure.

Specifically, illustrative examples of the liquid epoxy resin include "HP4032", "HP4032D", and "HP-4032-SS" (naphthalene type epoxy resins), manufactured by DIC Corp.; "828US", "828EL", "jER828EL", "825", and "Epikote 828EL" (bisphenol A type epoxy resins), manufactured by Mitsubishi Chemical Corp.; "jER807" and "1750" (bisphenol F type epoxy resins), manufactured by Mitsubishi Chemical Corp.; "jER152" (a phenol novolak type epoxy resin), manufactured by Mitsubishi Chemical Corp.; "630", "630LSD", and "604" (glycidylamine type epoxy resins), manufactured by Mitsubishi Chemical Corp.; "ED-523T" (a glycyrol type epoxy resin), manufactured by Adeka Corp.; "EP-3950L" and "EP-3980S" (glycidylamine type epoxy resins), manufactured by Adeka Corp.; "EP-4088S" (a dicyclopentadiene type epoxy resin), manufactured by Adeka Corp.; "ZX1059" (a mixture of a bisphenol A type epoxy resin and a bisphenol F type epoxy resin), manufactured by Nippon Steel & Sumikin Chemical Co., Ltd.); "EX-721" (a glycidyl ester type epoxy resin), manufactured by Nagase ChemteX Corp.; "Celloxide 2021P" (an alicyclic epoxy resin having an ester skeleton), manufactured by Daicel Corp.; "PB-3600" manufactured by Daicel Corp., and "JP-100" and "JP-200" (epoxy resins having a butadiene skeleton), manufactured by Nippon Soda Co., Ltd.; and "ZX1658" and "ZX1658GS" (liquid 1,4-glycidylcyclohexane type epoxy resins), manufactured by Nippon Steel & Sumikin Chemical Co., Ltd. The liquid epoxy resin may be used singly or as a combination of two or more of these resins.

As for the solid epoxy resin, a solid epoxy resin having three or more epoxy groups in one molecule thereof is preferable, while an aromatic solid epoxy resin having three or more epoxy groups in one molecule thereof is more preferable.

The solid epoxy resin is preferably a bixylenol type epoxy resin, a naphthalene type epoxy resin, a naphthalene type four-functional epoxy resin, a naphthol novolak type epoxy resin, a cresol novolak type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, a bisphenol AF type epoxy resin, a phenolaralkyl type epoxy resin, a tetraphenylethane type epoxy resin, a phenolphthalimidine type epoxy resin, and a phenolphthalein type epoxy resin.

Specifically, illustrative examples of the solid epoxy resin include "HP4032H" (a naphthalene type epoxy resin), manufactured by DIC Corp.; "HP-4700" and "HP-4710" (naphthalene type four-functional epoxy resins), manufactured by DIC Corp.; "N-690" (a cresol novolak type epoxy resin), manufactured by DIC Corp.; "N-695" (a cresol novolak type epoxy resin), manufactured by DIC Corp.; "HP-7200", "HP-7200HH", "HP-7200H", and "HP-7200L" (dicyclopentadiene type epoxy resins), manufactured by DIC Corp.); "EXA-7311", "EXA-7311-G3", "EXA-7311-G4", "EXA-7311-G4S", and "HP6000" (naphthylene ether type epoxy resins), manufactured by DIC Corp.; "EPPN-502H" (a trisphenol type epoxy resin), manufactured by Nippon Kayaku Co., Ltd.; "NC7000L" (a naphthol novolak type epoxy resin), manufactured by Nippon Kayaku Co., Ltd.; "NC3000H", "NC3000", "NC3000L", "NC3000FH", and "NC3100" (biphenyl type epoxy resins) manufactured by Nippon Kayaku Co., Ltd.; "ESN475V" (a naphthalene type epoxy resin), manufactured by NIPPON STEEL Chemical & Material Co., Ltd.; "ESN485" (a naphthol type epoxy resin), manufactured by NIPPON STEEL Chemical & Material Co., Ltd.; "ESN375" (a dihydroxynaphthalene type epoxy resin), manufactured by NIPPON STEEL Chemical & Material Co., Ltd.; "YX4000H", "YX4000", "YX4000HK", and "YL7890" (bixylenol type epoxy resins), manufactured by Mitsubishi Chemical Corp.; "YL6121" (a biphenyl type epoxy resin), manufactured by Mitsubishi Chemical Corp.; "YX8800" (an anthracene type epoxy resin), manufactured by Mitsubishi Chemical Corp.; "YX7700" (a phenolaralkyl type epoxy resin), manufactured by Mitsubishi Chemical Corp.; "PG-100" and "CG-500" manufactured by Osaka Gas Chemicals Co., Ltd.; "YL7760" (a bisphenol AF type epoxy resin), manufactured by Mitsubishi Chemical Corp.; "YL7800" (a fluorene type epoxy resin), manufactured by Mitsubishi Chemical Corp.; "jER1010" (a bisphenol A type epoxy resin), manufactured by Mitsubishi Chemical Corp.; "jER1031S" (a tetraphenylethane type epoxy resin), manufactured by Mitsubishi Chemical Corp.; and "WHR991S" (a phenolphthalimidine type epoxy resin), manufactured by Nippon Kayaku Co., Ltd. The solid epoxy resin may be used singly, or as a combination of two or more of these resins.

The mass ratio of the solid epoxy resin to the liquid epoxy resin (solid epoxy resin/liquid epoxy resin) is not particularly restricted; this is preferably 10 or less, more preferably 5 or less, still more preferably 1 or less, and yet more preferably 0.5 or less, while especially preferably 0.1 or less.

The epoxy equivalent of (A) the epoxy resin is preferably in the range of 50 to 5,000 g/eq., more preferably in the range of 60 to 2,000 g/eq., and still more preferably in the range of 70 to 1,000 g/eq., while yet more preferably in the range of 80 to 500 g/eq. The epoxy equivalent is the mass of the compound per one equivalent of the epoxy group. The epoxy equivalent can be measured in accordance with JIS K7236.

The weight-average molecular weight (Mw) of (A) the epoxy resin is preferably in the range of 100 to 5,000, and more preferably in the range of 250 to 3,000, while still more preferably in the range of 400 to 1,500. The weight-average molecular weight of the resin can be measured in terms of polystyrene by a gel permeation chromatography (GPC) method.

The content of (A) the epoxy resin in the resin composition is not particularly restricted, but from a viewpoint to enhance the prescribed effects of the present invention, the content thereof relative to 100% by mass of the nonvolatile components in the resin composition is preferably 0.1% or more by mass, and more preferably 0.2% or more by mass, while still more preferably 0.5% or more by mass, 1% or more by mass, 2% or more by mass, 3% or more by mass, or 5% or more by mass. The upper limit of (A) the epoxy resin in the resin composition is not particularly restricted; the value thereof relative to 100% by mass of the nonvolatile components in the resin composition is, for example, 80% or less by mass, 60% or less by mass, 40% or less by mass, or 30% or less by mass.

(B) Epoxy Curing Agent

The resin composition according to the present invention includes (B) the epoxy curing agent. The epoxy curing agent may be used singly or as a combination of two or more of the curing agents with an arbitrary ratio.

Illustrative examples of the epoxy curing agent include (B-1) an active ester compound and (B-2) an epoxy curing agent other than the active ester compound. From a viewpoint to obtain the cured product having excellent dielectric characteristics, it is preferable that the component (B) include (B-1) the active ester compound.

In general, compounds having two or more ester groups having a high reactivity in one molecule can be preferably used as (B-1) the active ester compound; these esters being a phenol ester, a thiophenol ester, an N-hydroxylamine ester, an ester of a heterocyclic hydroxy compound, and the like. The active ester compound is preferably the compound that is obtained by a condensation reaction of a carboxylic acid compound and/or a thiocarboxylic acid compound with a hydroxy compound and/or a thiol compound. In particular, from a viewpoint to improve the heat resistance, the active ester compound obtained from a carboxylic acid compound and a hydroxy compound is preferable, while the active ester compound obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid. Illustrative examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, 3-naphthol, 1,5-dihydroxy naphthalene, 1,6-dihydroxy naphthalene, 2,6-dihydroxy naphthalene, dihydroxy benzophenone, trihydroxy benzophenone, tetrahydroxy benzophenone, phloroglucin, benzene triol, a dicyclopentadiene type diphenol compound, and phenol novolak. Here, the "dicyclopentadiene type diphenol compound" means the diphenol compound obtained by condensation of one dicyclopentadiene molecule with two phenol molecules.

Specifically, as (B-1) the active ester compound, preferable are a dicyclopentadiene type active ester compound, a naphthalene type active ester compound containing a naphthalene structure, an active ester compound containing an acetylated phenol novolak, and an active ester compound containing a benzoylated phenol novolak. Among these, at least one kind selected from the dicyclopentadiene type active ester compound and the naphthalene type active ester compound is more preferable, while the dicyclopentadiene type active ester compound is still more preferable. As for the dicyclopentadiene type active ester type curing agent, an active ester compound containing a dicyclopentadiene type diphenol structure is preferable. Here, the "dicyclopentadiene type diphenol structure" means a divalent structure unit formed of phenylene-dicyclopentylene-phenylene.

Illustrative examples of the commercially available product of (B-1) the active ester compound include: as the active ester compound containing a dicyclopentadiene type diphenol structure, "EXB9451", "EXB9460", "EXB9460S", "EXB-8000L", "EXB-8000L-65M", "EXB-8000L-65TM", "HPC-8000L-65TM", "HPC-8000", "HPC-8000-65T", "HPC-8000H", and "HPC-8000H-65TM" (all of these are manufactured by DIC Corp.); as the active ester compound containing a naphthalene structure, "EXB-8100L-65T", "EXB-8150-60T", "EXB-8150-62T", "EXB-9416-70BK", "HPC-8150-60T", and "HPC-8150-62T" (all of these are manufactured by DIC Corp.); as the active ester compound containing phosphorous, "EXB9401" (manufactured by DIC Corp.); as the active ester compound containing an acetylated phenol novolak, "DC808" (manufactured by Mitsubishi Chemical Corp.); as the active ester compound containing a benzoylated phenol novolak, "YLH1026", "YLH1030", and "YLH1048" (all of these are manufactured by Mitsubishi Chemical Corp.); and as the active ester compound containing a styryl group and a naphthalene structure, "PC1300-02-65MA" (manufactured by Air Water Inc.).

The equivalent of the active ester group of (B-1) the active ester compound is preferably in the range of 50 to 500 g/eq., and more preferably in the range of 50 to 400 g/eq., while still more preferably in the range of 100 to 300 g/eq. The equivalent of the active ester group is the mass of the compound per 1 equivalent of the active ester group.

The content of (B-1) the active ester compound in the resin composition is not particularly restricted. From a viewpoint to enhance the prescribed effects of the present invention, the content thereof relative to 100% by mass of the nonvolatile components in the resin composition is preferably 0.2% or more by mass, and more preferably 0.4% or more by mass, while still more preferably 1% or more by mass, 2% or more by mass, 4% or more by mass, 6% or more by mass, or 10% or more by mass. The upper limit of the content of (B-1) the active ester compound in the resin composition is not particularly restricted; the value thereof relative to 100% by mass of the nonvolatile components in the resin composition is, for example, 90% or less by mass, 70% or less by mass, 50% or less by mass, or 40% or less by mass. In one embodiment, the content of the component (B-1) is more than the content of the component (A), preferably equal to or less than the twice the amount of the component (A).

Illustrative examples of (B-2) the epoxy curing agent other than the active ester compound include a phenol type curing agent, a naphthol type curing agent, an acid anhydride type curing agent, a thiol type curing agent, a benzoxazine type curing agent, a cyanate ester type curing agent, a carbodiimide type curing agent, and an imidazole type curing agent. In one embodiment, the phenol type curing agent is used as the component (B-2) that is combined with the component (B-1). Illustrative examples of the commercially available phenol type curing agent include "LA-3018-50P" (a cresol novolak type curing agent containing a triazine skeleton) manufactured by DIC Corp.

The equivalent of the active ester group in the component (B-2) is preferably in the range of 50 to 500 g/eq., and more preferably in the range of 50 to 400 g/eq., while still more preferably in the range of 100 to 300 g/eq. The equivalent of the active ester group is the mass of the compound per 1 equivalent of the active ester group.

The content of the component (B-2) in the resin composition is not particularly restricted; for example, the content thereof relative to 100% mass of the nonvolatile components in the resin composition can be 5% or less by mass, 4% or less by mass, 3% or less by mass, or 2% or less by mass. The lower limit of the content of the component (B-2) in the resin composition is 0% by mass (namely, this component is not included), and not particularly restricted; for example, the value thereof can be 0.01% or more by mass, 0.1% or more by mass, or 0.2% or more by mass. Preferably, the content of the component (B-2) is less than the content of the component (B-1).

The content of the component (B) in the resin composition is not particularly restricted. From a viewpoint to enhance the prescribed effects of the present invention, the content thereof relative to 100% mass of the nonvolatile components in the resin composition is preferably 0.2% or more by mass, and more preferably 0.4% or more by mass, while still more preferably 1% or more by mass, 2% or more by mass, 4% or more by mass, 6% or more by mass, or 10% or more by mass. The upper limit of the content of the component (B) in the resin composition is not particularly restricted; the value thereof relative to 100% mass of the nonvolatile components in the resin composition is, for example, 90% or less by mass, 70% or less by mass, 50% or less by mass, or 40% or less by mass.

In one embodiment, the content (parts by mass) of the component (B) is more than the content (parts by mass) of the component (A), and preferably equal to or less than the twice the amount of the component (A).

(C) First Specified Polyimide Resin

The resin composition according to the first embodiment of the present invention includes the first specified polyimide resin as the component (C). The component (C) may be used singly or a combination of two or more kinds with an arbitrary ratio. As can be seen in Examples to be described later, the resin composition according to the first embodiment of the present invention can express the prescribed effects of the present invention when the component (C) is included in the epoxy curing system.

The first specified polyimide resin includes a structural unit represented by the following formula (c1) (hereinafter, this is also called "structural unit (c1)"). The number of the structural unit(s) (c1) in the first specified polyimide resin is 1 or more, but not particularly restricted; this number can be 100 or less, 50 or less, or 30 or less. When there are a plurality of the structural units (c1), these structural units (c1) may be connected to each other as the repeating units, or are not necessarily connected to each other. When they are not connected to each other, it is preferable that another structural unit (for example, the structural unit represented by the formula (c2) to be described later) intervenes between these structural units (c1).

The structural unit (c1) is represented by the following formula (c1).

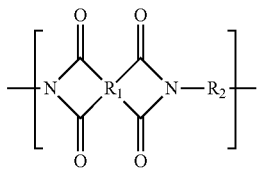

(In the formula (c1),
R$_1$ is a tetravalent group represented by the following formula (c1-1); and
R$_2$ is a divalent group represented by the following formula (c1-2).

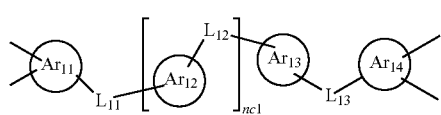

(In the formula (c1-1),
Ar$_{11}$, Ar$_{12}$, Ar$_{13}$, and Ar$_{14}$ each independently represent an optionally substituted aromatic ring;
L$_{11}$, L$_{12}$, and L$_{13}$ each independently represent a divalent connecting group; and
nc1 represents an integer of 0 or more.)

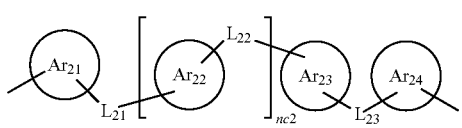

(In the formula (c1-2),
Ar$_{21}$, Ar$_{22}$, Ar$_{23}$, and Ar$_{24}$ each independently represent an optionally substituted aromatic ring;
L$_{21}$, L$_{22}$, and L$_{23}$ each independently represent a divalent connecting group; and
nc2 represents an integer of 1 or more.)]

In the formula (c1-1), the aromatic ring represented by Ar$_{11}$, Ar$_{12}$, Ar$_{13}$, and Ar$_{14}$ (hereinafter, this is also called "aromatic ring C") is preferably an aromatic ring having 6 to 100 carbon atoms, while more preferably 6 to 50 carbon atoms; and still more preferably an aromatic carbon ring having 6 to 100 carbon atoms, while yet more preferably 6 to 50 carbon atoms. Accordingly, in one preferred embodiment, in the formula (c1-1), Ar$_{11}$, Ar$_{12}$, Ar$_{13}$, and Ar$_{14}$ each independently represent an optionally substituted aromatic carbon ring having 6 to 14 carbon atoms. Here, in this specification the term "aromatic ring" means the ring complying the Huckel rule that the number of electrons included in the π-electron system on the ring is 4n+2 (here, n is a natural number); and this includes a monocyclic aromatic ring and a condensed aromatic ring having two or more monocyclic aromatic rings condensed. The aromatic ring may be a carbon ring or a hetero ring. Illustrative examples of the aromatic ring include: monocyclic aromatic rings such as a benzene ring, a furan ring, a thiophene ring, a pyrrole ring, a pyrazole ring, an oxazole ring, an isoxazole ring, a thiazole ring, an imidazole ring, a pyridine ring, a pyridazine ring, a pyrimidine ring, and a pyrazine ring; condensed rings having two or more monocyclic aromatic rings condensed, such as a naphthalene ring, an anthracene ring, a benzofuran ring, an isobenzofuran ring, an indole ring, an isoindole ring, a benzothiophen ring, a benzoimidazole ring, an indazole ring, a benzoxazole ring, a benzoisoxazole ring, a benzothiazole ring, a quinoline ring, an isoquinoline ring, a quinoxaline ring, an acridine ring, a quinazoline ring, a cinnoline ring, and a phthalazine ring; and condensed rings having one or more monocyclic aromatic rings condensed with one or more monocyclic nonaromatic rings, such as an indane ring, a fluorene ring, and a tetralin ring. Among these, the aromatic carbon ring having 6 to 14 carbon atoms is preferable, while the benzene ring is more preferable.

When in the formula (c1-1), Ar$_{11}$, Ar$_{12}$, Ar$_{13}$, and Ar$_{14}$ each represents an aromatic ring having a substituent group, there is no restriction in the number of the substituent groups. These substituent groups like this (hereinafter, this is also called "substituent S") each is independently a halogen atom, an alkyl group, a cycloalkyl group, an alkoxy group, a cycloalkyloxy group, an aryl group, an aryloxy group, an arylalkyl group, an arylalkoxy group, a monovalent heterocyclic group, an alkylidene group, an amino group, a silyl group, an acyl group, an acyloxy group, a carboxy group, a sulfo group, a cyano group, a nitro group, a hydroxy group, a mercapto group, and an oxo group.

In the formula (c1-1), the divalent connecting group represented by L$_{11}$, L$_{12}$, and L$_{13}$ is the divalent group formed of 1 or more skeleton atoms (for example, 1 to 3,000, 1 to 1,000, 1 to 100, or 1 to 50) preferably selected from a carbon atom, an oxygen atom, a nitrogen atom, a sulfur atom, and a silicon atom. Illustrative examples of the divalent connecting group include —SO$_2$—, —CO—, —COO—, —O—, —S—, —O—C$_6$H$_4$—O— (here, —C$_6$H$_4$— represents a phenylene group), —O—C$_6$H$_4$—C(CH$_3$)$_2$—C$_6$H$_4$—O—, —COO—(CH$_2$)$_q$—OCO— (here, q represents an integer of 1 to 20), —COO—H$_2$C—HC(—O—C(=O)—CH$_3$)—CH$_2$—OCO—, an alkylene group, an alkenylene group, an alkynylene group, an arylene group, a heteroarylene group, —C(=O)—, —C(=O)—O—, —NR$^0$— (here, R$^0$ represents a hydrogen atom and an alkyl group having 1 to 3 carbon atoms), and —C(=O)—NR$^0$—. The alkylene group is preferably the alkylene group having 1 to 10 carbon atoms, and more preferably the alkylene group having 1 to 6 carbon atoms, while still more preferably the alkylene group having 1 to 5 carbon atoms, or the alkylene group having 1 to 4 carbon atoms. Illustrative examples of the alkylene group include a methylene group, an ethylene group, a propylene group, a butylene group, a pentylene group, a hexylene group, and a dimethylmethylene group, while the dimethylmethylene group is preferable. The alkenylene group is preferably the alkenylene group having 2 to 10 carbon atoms, and more preferably the alkenylene group having 2 to 6 carbon atoms, while still more preferably the alkenylene group having 2 to 5 carbon atoms. The arylene group or the heteroarylene group is preferably the arylene group or the heteroarylene group having 6 to 20 carbon atoms, while more preferably the arylene group or the heteroarylene group having 6 to 10 carbon atoms. The alkyl group, the alkylene group, the alkenylene group, the alkynylene group, the arylene group, and the heteroarylene group may further include a substituent group. Examples of the substituent group are the same as those of the substituent group C. It is preferable that the divalent connecting groups represented by L$_{11}$, L$_{12}$, and L$_{13}$ do not include an aromatic ring. In one embodiment, the divalent connecting group represented by L$_{11}$ and the divalent connecting group represented by L$_{13}$ are the same, and the divalent connecting group represented by L$_{11}$ and the divalent connecting groups represented by $L_{12}$ are different with each other. In one preferred one embodiment, in the formula (c1-1), $L_{11}$ and $L_{13}$ are —O—, and $L_{12}$ is an optionally substituted alkylene group; in one more preferred embodiment, in the formula (c1-1), $Ar_{11}$, $Ar_{12}$, $Ar_{13}$, and $Ar_{14}$ each independently represent an optionally substituted aromatic carbon ring having 6 to 14 carbon atoms, and in the formula (c1-1), $L_{11}$ and $L_{13}$ are —O—, and $L_{12}$ is an optionally substituted alkylene group. In one still more preferred embodiment, in the formula (c1-1), $L_{11}$ and $L_{13}$ are —O—, and $L_{12}$ is a dimethylmethylene group.

In the formula (c1-2), examples of the aromatic ring represented by $Ar_{21}$, $Ar_{22}$, $Ar_{23}$, and $Ar_{24}$ and examples of the substituent group optionally possessed by these aromatic rings are the same as those of the aromatic ring C and those of the substituent group S, respectively.

Accordingly, in one preferred embodiment, in the formula (c1-2), $Ar_{21}$, $Ar_{22}$, $Ar_{23}$, and $Ar_{24}$ each is independently an optionally substituted aromatic carbon ring having 6 to 14 carbon atoms. Also, in one preferred embodiment, in the formula (c1-2), $L_{21}$ and $L_{23}$ are —O—, and $L_{22}$ is an optionally substituted alkylene group; in one more preferred embodiment, in the formula (c1-2), $Ar_{21}$, $Ar_{22}$, $Ar_{23}$, and $Ar_{24}$ each is independently an optionally substituted aromatic carbon ring having 6 to 14 carbon atoms, and in the formula (c1-2), $L_{21}$ and $L_{23}$ are —O—, and $L_{22}$ is an optionally substituted alkylene group. In one still more preferred embodiment, in the formula (c1-2), $L_{21}$ and $L_{23}$ are —O—, and $L_{22}$ is a dimethylmethylene group. In one especially preferred embodiment, in the formula (c1-1), $Ar_{11}$, $Ar_{12}$, $Ar_{13}$, and $Ar_{14}$ each is independently an optionally substituted aromatic carbon ring having 6 to 14 carbon atoms, and in the formula (c1-2), $Ar_{21}$, $Ar_{22}$, $Ar_{23}$, and $Ar_{24}$ each is independently an optionally substituted aromatic carbon ring having 6 to 14 carbon atoms. In another especially preferred embodiment, in the formula (c1-1), $L_{11}$ and $L_{13}$ are —O—, and $L_{12}$ is an optionally substituted alkylene group, and in the formula (c1-2), $L_{21}$ and $L_{23}$ are —O—, and $L_{22}$ is an optionally substituted alkylene group.

In one further especially preferred embodiment, in the formula (c1-1), $Ar_{11}$, $Ar_{12}$, $Ar_{13}$, and $Ar_{14}$ each is independently an optionally substituted aromatic carbon ring having 6 to 14 carbon atoms, and in the formula (c1-2), $Ar_{21}$, $Ar_{22}$, $Ar_{23}$, and $Ar_{24}$ each is independently an optionally substituted aromatic carbon ring having 6 to 14 carbon atoms, and in the formula (c1-1), $L_{11}$ and $L_{13}$ are —O—, and $L_{12}$ is an optionally substituted alkylene group, and in the formula (c1-2), $L_{21}$ and $L_{23}$ are —O—, and $L_{22}$ is an optionally substituted alkylene group.

In the formula (c1-1), nc1 represents preferably an integer of 1 or more. The upper limit of the integer represented by nc1 is not particularly restricted; for example, this can be 50, 40, 30, or 20.

In the formula (c1-2), nc2 represents preferably an integer of 2 or more. The upper limit of the integer represented by nc2 is not particularly restricted; for example, this can be 60, 50, 40, or 30. In a certain embodiment, in the formula (c1-1), the integer represented by nc2 is greater than the integer represented by nc1 and smaller than nc1+5. In a specified embodiment, in the formula (c1-1), nc1 is 1, and nc2 is 2.

The above-mentioned structural unit (c1) may be obtained, for example, by a publicly known production method of a polyimide resin, typically, by the method in which the monomer composition including a tetracarboxylic dianhydride and a diamine compound is polymerized and imidized, or by the method in which the monomer composition including a tetracarboxylic dianhydride and a diisocyanate compound is polymerized and imidized. Here, note that the first specified polyimide resin may partially include a polyamic acid structure that can be formed in the course of imidization.

The structural unit (c1) in the specified embodiment can be obtained by causing the reaction, for example, 2,2-bis[4-(3,4-dicarboxyphenoxy)phenyl]propane dianhydride (compound represented by the following formula (I); hereinafter, this is also called "BPADA") with 4,4'-[1,4-phenylenebis[(1-methylethylidene)-4,1-phenyleneoxy]]bisbenzeneamine (compound represented by the following formula (II); hereinafter this is also called "BPPAN"). Namely, in the structural unit (c1) here, $R_1$ is the skeleton derived from BPADA and $R_2$ is the skeleton derived from BPPAN.

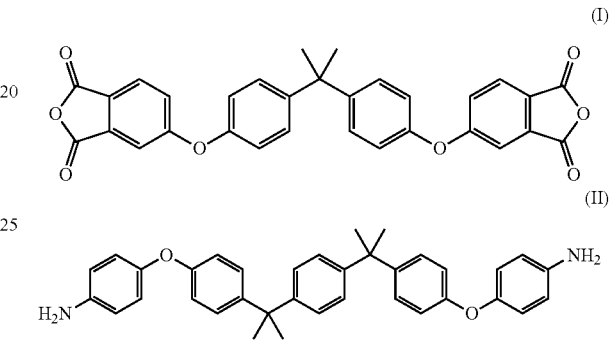

The first specified polyimide may be the resin that further includes a structural unit represented by the following formula (c2) (hereinafter, this is also called "structural unit (c2)"). Therefore, in a certain embodiment, the component (C) is the resin including the structural unit represented by the following formula (c2). In the first specified polyimide resin, the number of the structural unit(s) (c2) is 0 or more, and not particularly restricted; this can be 100 or less, 50 or less, or 30 or less. The structural unit (c2) may be connected to the $R_2$ group in the structural unit (c1) via the nitrogen atom in the imide group, or is not necessarily connected to the structural unit (c1). When there are a plurality of the structural units (c2), the structural unit (c2) may be connected with each other as the repeating unit, or is not necessarily connected with each other. When they are not connected with each other, it is preferable that other structural unit (for example, the structural unit (C1)) intervene between a plurality of the structural units (c2).

The structural unit (c2) is represented by the following formula (c2).

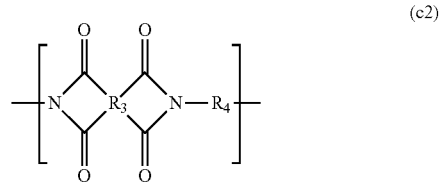

(In the formula (c2), $R_3$ represents an optionally substituted tetravalent aliphatic group or an optionally substituted tetravalent aromatic group, and $R_4$ represents an optionally substituted divalent aliphatic group or an optionally substituted divalent aromatic group). Here, when $R_3$ is the same as $R_1$, $R_4$ is different from $R_2$, and when $R_4$ is the same as $R_2$, $R_3$ is different from $R_1$.

In the formula (c2), the tetravalent aliphatic group represented by $R_3$ is the tetravalent group that includes at least a carbon atom, preferably formed of one or more skeleton atoms (for example, 1 to 3,000, 1 to 1,000, 1 to 100, or 1 to 50) selected from a carbon atom, an oxygen atom, a nitrogen atom, a sulfur atom, and a silicon atom. In the formula (c2), the tetravalent aliphatic group represented by $R_3$ is more preferably the tetravalent aliphatic group having 1 to 100 carbon atoms, while still more preferably the tetravalent aliphatic group having 1 to 50 carbon atoms. In the formula (c2), when $R_3$ represents the tetravalent aliphatic group having a substituent group, examples of the substituent group are the same as the examples of the substituent group S.

In the formula (c2), the tetravalent aromatic group represented by $R_3$ is preferably the tetravalent aromatic group having 6 to 100 carbon atoms, more preferably 6 to 50 carbon atoms, and still more preferably the tetravalent aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic rings represented by $Ar_{11}$, $Ar_{12}$, $Ar_{13}$, and $Ar_{14}$ in the formula (c1-1). When in the formula (c2), $R_3$ represents the tetravalent aromatic group having a substituent group, examples of this substituent group are the same as the examples of the substituent S.

The tetravalent aromatic group represented by $R_3$ may be a group obtainable from the tetracarboxylic dianhydride having an optionally substituted aromatic group by removal of two acid anhydride groups. The aromatic group includes at least an aromatic ring. Examples of the aromatic ring included in the aromatic group are the same as the examples of the aromatic ring C. When the aromatic group has a substituent group, examples of this substituent group are the same as the examples of the substituent group S. Specific illustrative examples of the tetracarboxylic dianhydride having an optionally substituted aromatic group include BPADA, pyromellitic dianhydride, 3,3',4,4'-biphenyltetracarboxylic dianhydride, 4,4'-oxydiphthalic anhydride, 3,3',4,4'-benzophenonetetracarboxylic dianhydride, and 3,3'4,4'-diphenylsulfonetetracarboxylic dianhydride.

In the formula (c2), the divalent aliphatic group represented by $R_4$ is the divalent group that includes at least a carbon atom, preferably formed of one or more skeleton atoms (for example, 1 to 3,000, 1 to 1,000, 1 to 100, or 1 to 50) selected from a carbon atom, an oxygen atom, a nitrogen atom, a sulfur atom, and a silicon atom. In the formula (c2), the divalent aliphatic group represented by $R_4$ is more preferably the divalent aliphatic group having 1 to 100 carbon atoms, while still more preferably the divalent aliphatic group having 1 to 50 carbon atoms. In the formula (c2), when, $R_4$ represents the divalent aliphatic group having a substituent group, examples of the substituent group are the same as those of the substituent group S, for example, an alkyl group having 1 to 6 carbon atoms. Therefore, in a certain embodiment, $R_4$ is an optionally substituted divalent aliphatic group, in which one of the substituents is an alkyl group having 1 to 6 carbon atoms. Also, in the specified embodiment, $R_4$ is an optionally substituted divalent aliphatic group, and the aliphatic divalent group is obtainable from isophoronediamine by removal of two amino groups thereof. When $R_4$ represents the optionally substituted divalent aliphatic group, this may be a group obtainable from the diamine compound having the optionally substituted aliphatic group by removal of two amino groups, the diamine compound being selected from 1,2-diaminoethane, 1,3-diaminopropane, 1,4-diaminobutane, 1,5-diaminopentane, 1,6-hexanediamine, 1,7-heptanediamine, 1,8-octanediamine, 1,9-nonanediamine, 1,10-decanediamine, 1,11-undecanediamine, and 1,12-dodecanediamine. These diamine compounds are characterized by the aliphatic groups therein being of a linear type.

When $R_4$ represents the optionally substituted divalent aliphatic group, this may be a group obtainable from the diamine compound having the optionally substituted aliphatic group by removal of two amino groups, the diamine compound being selected from 1,2-diaminopropane, 1,2-diamino-2-methylpropane, 1,3-diamino-2-methylpropane, 1,3-diamino-2,2-dimethylpropane, 1,3-diaminopentane, and 1,5-diamino-2-methylpentane. These diamine compounds are characterized by the aliphatic groups therein being of a branched type.

When $R_4$ represents the optionally substituted divalent aliphatic group, this may be a group obtainable from the diamine compound having the optionally substituted aliphatic group by removal of two amino groups, the diamine compound being selected from 5-amino-1,3,3-trimethylcyclohexanemethylamine (isophoronediamine), 1,4-diaminocyclohexane, 1,3-diaminocyclohexane, 1,4-cyclohexane bis(methylamine), 1,3-cyclohexane bis(methylamine), 4,4'-diaminodicyclohexylmethane, bis(4-amino-3-methylcyclohexyl)methane, 3(4),8(9)-bis(aminomethyl)tricyclo[5.2.1.0$^{2,6}$]decane, 2,5(6)-bis(aminomethyl)bicyclo[2.2.1]heptane, 1,3-diaminoadamantane, 3,3'-diamino-1,1'-biadamantyl, and 1,6-diaminoadamantane. These diamine compounds are characterized by the aliphatic group therein including an alicyclic carbon ring.

In the formula (c2), the divalent aromatic group represented by $R_4$ is preferably the divalent aromatic group having 6 to 100 carbon atoms, more preferably 6 to 50 carbon atoms, and still more preferably the divalent aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic ring C. When in the formula (c2), $R_4$ represents the divalent aromatic group having a substituent group, examples of this substituent group are the same as the examples of the substituent group S.

When $R_4$ represents the optionally substituted divalent aromatic group, this may be a group obtainable from the diamine compound having an optionally substituted aromatic group by removal of two amino groups, the diamine compound being selected from 4,4'-diaminodiphenyl ether, 1,4-phenylenediamine, and 2,2-bis[4-(4-aminophenoxy)phenyl]propane.

Here, when $R_3$ is the same as $R_1$, $R_4$ is different from $R_2$, and when $R_4$ is the same as $R_2$, $R_3$ is different from $R_1$.

In a certain embodiment, $R_3$ is the same as $R_1$. Namely, the structural unit (c2) is different from the structural unit (c1).

The structural unit (c2) can be obtained, for example, by a publicly known production method of a polyimide resin. The structural unit (c2) in the specified embodiment can be obtained, for example, by causing the reaction between BPADA and isophoronediamine. Namely, in the structural unit (c2), $R_3$ is the skeleton derived from BPADA, and $R_4$ is the skeleton derived from isophoronediamine. When $R_3$ is the same as $R_1$, $R_3$ and $R_1$ are the skeleton derived from BPADA. Here, the first specified polyimide resin may partially include a polyamic acid structure that can be formed in the course of imidization.

As far as the component (C) has the structural unit (c1), the terminal structure thereof is not particularly restricted. For example, the terminal structure of the component (C) may be an acid anhydride group, a carboxy group, or an amino group, derived from the raw material compounds of the component (C) (for example, an acid such as BPADA or an amine compound such as BPPAN). When maleic anhydride is further included in the raw material compound, the terminal structure of the component (C) may be the maleimide group.

The glass transition temperature $Tg^{(C)}$ (° C.) of the component (C) is preferably 140° C. or higher, more preferably 145° C. or higher, still more preferably 150° C. or higher, and yet more preferably 160° C. or higher, while especially preferably 170° C. or higher. The upper limit thereof is not particularly restricted; this can be 300° C. or lower, or the like. The glass transition temperature $Tg^{(C)}$ (° C.) can be measured by the same method as the method in "Assessment of Heat Resistance" to be described later.

From a viewpoint to enhance the prescribed effects of the present invention, the content ratio (percentage) of the structural unit (c1) in the component (C) is preferably 5% or more by mass, more preferably 10% or more by mass, still more preferably 20% or more by mass, and yet more preferably 30% or more by mass, while especially preferably 40% or more by mass. The content ratio (percentage) of the structural unit (c1) in the component (C) can be, for example, 98% or less by mass, 95% or less by mass, 90% or less by mass, or 85% or less by mass. Here, the content ratio (percentage) of the structural unit (c1) may be calculated from the ratio of the charging amount (parts by mass) of each of the raw materials to synthesize the component (C). Alternatively, after the molecular weight of the component (C) and the formula weight of the structural unit (c1) are determined, the content may be calculated as the ratio thereof to the molecular weight of the formula weight of the structural unit (c1). When the component (C) is a polymer, it is preferable that the content ratio (percentage) of the structural unit (c1), estimated from the polymerization degree, be within the range described above.

When the component (C) is the resin further including the structural unit (c2), the content ratio (percentage) of the structural unit (c2) may be 0% by mass (namely, the structural unit (c2) is not included), and the upper limit thereof is not restricted as far as the advantageous effects of the present invention is excessively impaired. Therefore, the content ratio (percentage) of the structural unit (c2) in the component (C) can be, for example, 1% or more by mass, 5% or more by mass, 10% or more by mass, 20% or more by mass, or 30% or more by mass, and 95% or less by mass, 90% or less by mass, 80% or less by mass, 70% or less by mass, or 60% or less by mass. Here, the content ratio (percentage) of the structural unit (c2) may be calculated by the same way as the content ratio (percentage) of the structural unit (c1). When the component (C) is a polymer, it is preferable that the content ratio (percentage) of the structural unit (c2), estimated from the polymerization degree, be within the range described above.

The weight-average molecular weight (Mw) of the component (C) is 1,000 or more, preferably in the range of 1,000 to 10,000, and more preferably in the range of 1,000 to 5,000, while still more preferably in the range of 1,000 to 3,000. The weight-average molecular weight of the resin can be measured in terms of polystyrene by a gel permeation chromatography (GPC) method.

The content of the component (C) in the resin composition is not particularly restricted, but from a viewpoint to enhance the prescribed effects of the present invention, the content thereof relative to 100% by mass of the nonvolatile components in the resin composition is preferably 0.01% or more by mass, and more preferably 0.1% or more by mass, while still more preferably 0.3% or more by mass, 0.4% or more by mass, 0.5% or more by mass, 0.6% or more by mass, or 0.7% or more by mass. The upper limit of the component (C) in the resin composition is not particularly restricted; the value thereof relative to 100% by mass of the nonvolatile components in the resin composition can be, for example, 30% or less by mass, 20% or less by mass, 15% or less by mass, or 10% or less by mass. Accordingly, in one preferred embodiment, the content of the component (C) relative to 100% by mass of the nonvolatile components in the resin composition is in the range of 0.01 to 30% by mass.

The content of the component (C) in the resin composition is not particularly restricted, but from a viewpoint to enhance the prescribed effects of the present invention, the content thereof relative to 100% by mass of the resin components in the resin composition is preferably 0.03% or more by mass, and more preferably 0.3% or more by mass, while still more preferably 0.9% or more by mass, 1.2% or more by mass, 1.5% or more by mass, 1.8% or more by mass, or 2.1% or more by mass. The upper limit of the component (C) in the resin composition is not particularly restricted; the value thereof relative to 100% by mass of the resin components in the resin composition can be, for example, 50% or less by mass, 40% or less by mass, 35% or less by mass, or 30% or less by mass. The resin components in the resin composition means the nonvolatile components in the resin composition except for (D) an inorganic filler to be described later.

(D) Inorganic Filler

The resin composition according to the present invention may include an inorganic filler as the component (D). In one preferred embodiment, the resin composition according to the present invention further includes (D) the inorganic filler. The resin composition including the component (D) can give the cured product thereof having excellent heat resistance (for example, glass transition temperature).

Illustrative examples of the component (D) include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among these, silica is especially preferable. Illustrative examples of the silica include amorphous silica, fused silica, crystalline silica, synthesized silica, and hollow silica. Spherical silica is preferable as the silica. The component (D) may be used singly or as a combination of two or more of these fillers.

Illustrative examples of the commercially available product of the component (D) include "UFP-30" manufactured by Denka Co., Ltd.; "SP60-05" and "SP507-05" manufactured by NIPPON STEEL Chemical & Material Co., Ltd.; "YC100C", "YA050C", YA050C-MJE", and "YA010C" manufactured by Admatechs Co., Ltd.; "UFP-30" manufactured by Denka Co., Ltd.; "Silfil NSS-3N", "Silfil NSS-4N", and "Silfil NSS-5N" manufactured by Tokuyama Corp.; "SC2500SQ", "SO-C4", "SO-C2", and "SO-C1" manufactured by Admatechs Co., Ltd.; and "DAW-03" and "FB-105FD" manufactured by Denka Co., Ltd.

Although the average particle diameter of the component (D) is not particularly restricted, this is preferably 10 µm or less, and more preferably 5 µm or less, while still more preferably 3 µm or less, 2 µm or less, 1 µm or less, or 0.7 µm or less. Although the lower limit of the average particle diameter thereof is not particularly restricted, this is preferably 0.01 µm or more, and more preferably 0.05 µm or more, while still more preferably 0.07 µm or more, 0.1 µm or more, or 0.2 µm or more. The average particle diameter of the component (D) can be measured with a laser diffraction scattering method based on the Mie scattering theory. Specifically, the particle diameter distribution of the inorganic filler on the volume basis is prepared by using a laser diffraction scattering type particle diameter distribution measurement apparatus.

The average particle diameter thereof can be measured as a median diameter. A measurement sample obtained by weighing 100 mg of the inorganic filler and 10 g of methyl ethyl ketone into a vial bottle followed by dispersing the resulting mixture with ultrasonic waves for 10 minutes may be used. This measurement sample was measured by using the laser diffraction type particle diameter distribution measurement instrument with a blue light and a red light of light source wavelengths using a flow cell method to obtain the particle diameter distribution of the inorganic filler on the volume basis; then, from the thereby obtained particle diameter distribution, the average particle diameter was calculated as the median diameter. Illustrative examples of the laser diffraction type particle diameter distribution measurement instrument include "LA-960" manufactured by Horiba Ltd.

Although the specific surface area of the component (D) is not particularly restricted, this is preferably 0.1 $m^2/g$ or more, and more preferably 0.5 $m^2/g$ or more, while still more preferably 1 $m^2/g$ or more, 3 $m^2/g$ or more, or 5 $m^2/g$ or more. Although the upper limit of the specific surface area thereof is not particularly restricted, this is preferably 100 $m^2/g$ or less, and more preferably 80 $m^2/g$ or less, while still more preferably 60 $m^2/g$ or less, 50 $m^2/g$ or less, or 40 $m^2/g$ or less. The specific surface area of the component (D) can be measured by adsorbing a nitrogen gas onto a sample surface in accordance with the BET method using the specific surface area measurement instrument ("Macsorb HM-1210"; manufactured by Mountech Co., Ltd.); then, the specific surface area can be obtained by calculation by the BET multipoint method.

It is preferable that the component (D) be surface-modified by a suitable surface modifying agent. With the surface modification, the humidity resistance and dispersion property of the component (D) can be enhanced. Illustrative examples of the surface modifying agent include: silane coupling agents such as a vinyl type silane coupling agent, an epoxy type silane coupling agent, a styryl type silane coupling agent, a (meth)acryl type silane coupling agent, an amino type silane coupling agent, an isocyanurate type silane coupling agent, a ureido type silane coupling agent, a mercapto type silane coupling agent, an isocyanate type silane coupling agent, and an acid anhydride type silane coupling agent; non-silane coupling-alkoxysilane compounds such as methyl trimethoxy silane and phenyl trimethoxy silane; and a silazane compound. These surface modifying agents may be used singly or as a combination of two or more of them.

Illustrative examples of the commercially available surface modifying agent include "KBM403" (3-glycidoxypropyl trimethoxy silane) manufactured by Shin-Etsu Chemical Co., Ltd.; "KBM803" (3-mercaptopropyl trimethoxy silane) manufactured by Shin-Etsu Chemical Co., Ltd.; "KBE903" (3-aminopropyl triethoxy silane) manufactured by Shin-Etsu Chemical Co., Ltd.; "KBM573" (N-phenyl-3-aminopropyl trimethoxy silane) manufactured by Shin-Etsu Chemical Co., Ltd.; and "SZ-31" (hexamethyl disilazane) manufactured by Shin-Etsu Chemical Co., Ltd.

From a viewpoint to enhance the dispersibility of the inorganic filler, surface modification by the surface modifying agent is done preferably to the degree within a prescribed range. Specifically, it is preferable that 100% by mass of the inorganic filler be surface-modified with 0.2 to 5% by mass of the surface modifying agent.

The degree of surface modification by the surface modifying agent may be evaluated by the carbon amount per unit surface area of the inorganic filler. From a viewpoint to enhance the dispersibility of the inorganic filler, the carbon amount per unit surface area of the inorganic filler is preferably 0.02 $mg/m^2$ or more, and more preferably 0.1 $mg/m^2$ or more, while still more preferably 0.2 $mg/m^2$ or more. On the other hand, from a viewpoint to prevent the increase in the melt viscosity of the resin composition or the melt viscosity in the state of a sheet, this carbon amount is preferably 1.0 $mg/m^2$ or less, and more preferably 0.8 $mg/m^2$ or less, while still more preferably 0.5 $mg/m^2$ or less. The carbon amount per unit surface area of the component (D) can be measured after the inorganic filler whose surface has been modified is cleaned by a solvent (for example, methyl ethyl ketone (MEK)). Specifically, after a sufficient amount of MEK as the solvent is added to the inorganic filler whose surface has been modified with a surface modifying agent, the resulting mixture is cleaned by ultrasonic cleaning at 25° C. for 5 minutes. The supernatant solution thereof is removed; and then, after the solid component remained is dried, the carbon amount per unit surface area of the inorganic filler can be measured by using a carbon analysis apparatus. The carbon analysis apparatus such as "EMIA-320V" manufactured by Horiba Ltd., and the like may be used.

From a viewpoint to enhance the prescribed effects of the present invention, the content of the component (D) in the resin composition relative to 100% by mass of the nonvolatile components in the resin composition is preferably 40% or more by mass, and more preferably 45% or more by mass, while still more preferably 50% or more by mass, 55% or more by mass, 60% or more by mass, more than 60% by mass, 65% or more by mass, or 70% or more by mass. The upper limit of the content of the component (D) is not particularly restricted; this is determined in accordance with the content of the resin components. Accordingly, in one preferred embodiment, the content of the component (D) relative to 100% by mass of the nonvolatile components in the resin composition is 40% or more by mass.

(E) Radically Polymerizable Compound

The resin composition according to the present invention may include a radially polymerizable compound as the component (E). Here, note that a compound having an epoxy group and the component (C) (and the component (C') and the component (C") to be described later) are excluded from the component (E). The radically polymerizable compound (E) may be used singly, or as a combination of two or more kinds arbitrarily.

The radically polymerizable compound (E) may be, for example, a compound having a radically polymerizable unsaturated group. There is no particular restriction in the radically polymerizable unsaturated group as far as this is radically polymerizable, but the ethylenic unsaturated group having a carbon-carbon double bond that is present in the terminal or inside of the molecule is preferable. Specifically, illustrative examples thereof include: unsaturated aliphatic groups such as an allyl group and a 3-cyclohexenyl group; aromatic groups having an unsaturated aliphatic group, such as a p-vinylphenyl group, a m-vinylphenyl group, and a styryl group; and α,β-unsaturated carbonyl groups such as an acryloyl group, a methacryloyl group, a maleoyl group, and a fumaroyl group. The radically polymerizable compound (E) has preferably one or more of the radically polymerizable unsaturated group, while more preferably two or more of the group.

There is no particular restriction in (E) the radically polymerizable compound; a wide range of publicly known radically polymerizable compounds may be used. Illustrative examples thereof include (E-1) a maleimide compound, (E-2) a vinylbenzyl compound, and (E-3) a radically polymerizable compound other than the maleimide compound and the vinylbenzyl compound.

(E-1) Maleimide Compound

The maleimide compound (E-1) is the organic compound not having an epoxy group but having one or more (preferably two or more) maleimide groups in one molecule. The maleimide compound (E-1) may be used singly, or as a combination of two or more kinds with an arbitrary ratio. It is preferable that (E-1) the maleimide compound include at least one maleimide compound selected from, for example, (E-1-1) a maleimide-terminated polyimide other than the component (A), (E-1-2) an aromatic maleimide compound other than the component (A), and (E-1-3) an aliphatic maleimide compound other than the component (A).

(E-1-1) Maleimide-Terminated Polyimide (E-1-1) The maleimide-terminated polyimide is the linear polyimide having maleimide groups at both the terminals thereof. (E-1-1) The maleimide-terminated polyimide may be the component that can be obtained by the imidization reaction of the composition including, for example, a diamine compound, maleic anhydride, and a tetracarboxylic dianhydride.

In one embodiment, (E-1-1) the maleimide-terminated polyimide is, for example, the bismaleimide compound represented by the following formula (E11a).

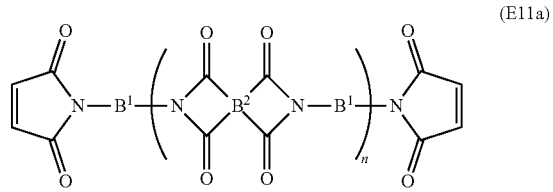

In the formula (E11a), each n+1 $B^1$ independently represents a divalent organic group (preferably an organic group containing a divalent ring (for example, a monocyclic non-aromatic or aromatic ring)) formed of 2 or more (for example, 2 to 3,000, 2 to 1,000, 2 to 100, or 2 to 50) skeleton atoms selected from, for example, a carbon atom, an oxygen atom, a nitrogen atom, and a sulfur atom (preferably a carbon atom); each of n $B^2$s independently represents a tetravalent organic group (preferably, an organic group containing a tetravalent ring (for example, a monocyclic non-aromatic or aromatic ring, preferably an aromatic ring) formed of 2 or more (for example, 2 to 3,000, 2 to 1,000, 2 to 100, or 2 to 50) skeleton atoms selected from, for example, a carbon atom, an oxygen atom, a nitrogen atom, and a sulfur atom (preferably a carbon atom); and n represents an integer of 1 or more (preferably an integer of 1 to 100, and more preferably an integer of 1 to 50, while especially preferably an integer of 1 to 20). Here, the n units may be the same in each unit, or may be different. Note that the formula (E11a) satisfies at least one of the conditions that $B^1$ is not $R_2$ described before and that $B^2$ is not $R_1$ described before.

In another embodiment, (E-1-1) the maleimide-terminated polyimide is preferably the bismaleimide compound represented by the following formula (E11b).

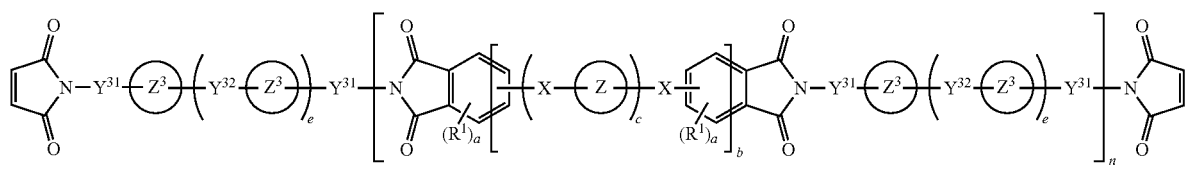

In the formula (E11b), each $Y^{31}$ independently represents a single bond, an alkylene group, or an alkenylene group; each $Y^{32}$ independently represents a single bond or a connecting group; each X independently represents a single bond or a connecting group; Z and $Z^3$ each independently represent an optionally substituted monocyclic non-aromatic ring, or an optionally substituted aromatic ring; each $R^1$ independently represents a substituent group (preferably an alkyl group); each a independently represents an integer of 0 to 2; each b independently represents an integer of 0 or 1; e represents an integer of 0, or 1 or more; and n represents an integer of 1 or more (preferably an integer of 1 to 100, and more preferably an integer of 1 to 50, while especially preferably an integer of 1 to 20).

The weight-average molecular weight (Mw) of (E-1-1) the maleimide-terminated polyimide is preferably in the range of 500 to 50,000, while more preferably in the range of 1,000 to 20,000.

The functional group equivalent of the maleimide group in (E-1-1) the maleimide-terminated polyimide is preferably in the range of 300 to 20,000 g/eq., while more preferably in the range of 500 to 10,000 g/eq.

Illustrative examples of the commercially available product of (E-1-1) the maleimide-terminated polyimide include "BMI-1500", "BMI-1700", and "BMI-3000J", manufactured by Designer Molecules Inc.

(E-1-2) Aromatic Maleimide Compound (E-1-2) The aromatic maleimide compound is the maleimide compound not having an epoxy group, not belonging to the component (E-1-1), containing one or more aromatic rings and one or more (preferably 2 or more) maleimide groups in one molecule. In one embodiment, (E-1-2) the aromatic maleimide compound may be an addition-polymerization type aromatic maleimide. (E-1-2) The aromatic maleimide compound may be the maleimide compound having one aromatic ring, such as N,N'-1,3-phenylene dimaleimide and N,N'-1,4-phenylene dimaleimide, or a maleimide compound having two or more aromatic rings, while the maleimide compound having two or more aromatic rings is preferable.

In one embodiment, (E-1-2) the aromatic maleimide compound is, for example, the maleimide compound represented by the following formula (E12).

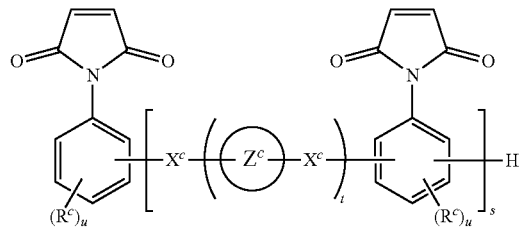

(E12)

In the formula (E12), each $R^c$ independently represents a substituent group; each $X^c$ independently represents a single bond or a connecting bond (preferably a single bond or an alkylene group); each $Z^c$ independently represents an optionally substituted monocyclic non-aromatic ring, or an optionally substituted aromatic ring (preferably an optionally substituted aromatic ring, while especially preferably an optionally substituted benzene ring); s represents an integer of 1 or more; each t independently represents an integer of 0, or 1 or more; each u independently represents an integer of 0 to 2 (preferably 0).

(E-1-2) The aromatic maleimide compound is preferably the maleimide compound represented by any of the following formulae (E12a), (E12b), (E12c), and (E12d).

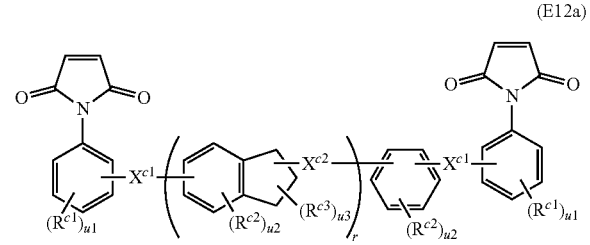

(E12a)

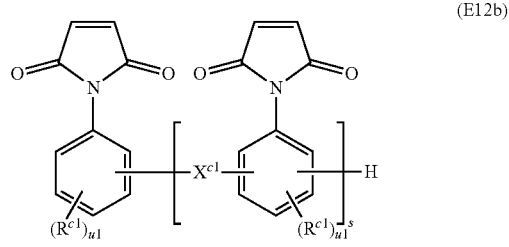

(E12b)

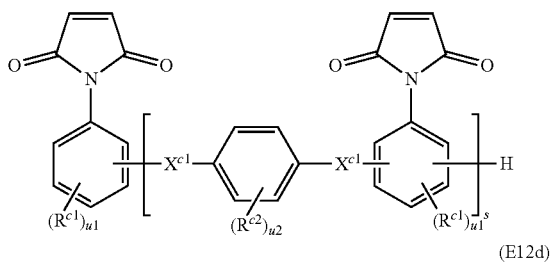

(E12c)

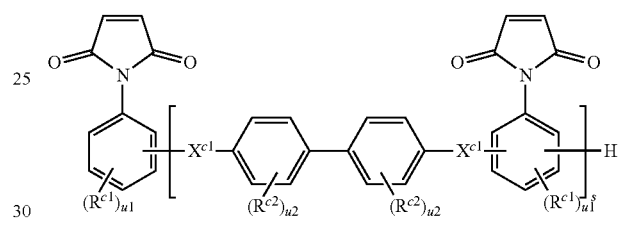

(E12d)

In the formulae (E12a) to (E12d), $R^{c1}$, $R^{c2}$, and $R^{c3}$ each independently represent an alkyl group; $X^{c1}$ and $X^{c2}$ each independently represent a single bond or an alkylene group; s represents an integer of 1 or more (preferably an integer of 1 to 100, and more preferably an integer of 1 to 50, while still more preferably an integer of 1 to 20); t' represents an integer of 1 to 5; and u1, u2, and u3 each independently represent an integer of 0 to 3. Note that in the formulae (E12a) to (E12d), the s unit, the t unit, the t' unit, the u unit, the u1 unit, the u2 unit, and the u3 units may be the same or different in each unit.

The functional group equivalent of the maleimide group in (E-1-2) the aromatic maleimide compound is preferably in the range of 50 to 2,000 g/eq., more preferably in the range of 100 to 1,000 g/eq., and still more preferably in the range of 150 to 700 g/eq., while especially preferably in the range of 200 to 500 g/eq.

Illustrative examples of the commercially available product of (E-1-2) the aromatic maleimide compound include "MIR-3000-70MT" (biphenylaralkyl novolak type polymaleimide) manufactured by Nippon Kayaku Co., Ltd.; "BMI-50P" manufactured by K-I Chemical Industry Co., Ltd.; "BMI-1000", "BMI-1000H", "BMI-1100", "BMI-1100H", "BMI-4000", and "BMI-5100", manufactured by Daiwa Kasei Industry Co., Ltd.; "BMI-4,4'-BPE" and "BMI-70" manufactured by K-I Chemical Industry Co., Ltd.; and "BMI-80" manufactured by K-I Chemical Industry Co., Ltd. Illustrative examples of (E-1-2) the aromatic maleimide compound include the maleimide resin e1a that is prepared in Synthesis Example 3 to be described later or a modified compound thereof.

(E-1-3) Aliphatic Maleimide Compound (E-1-3) The aliphatic maleimide compound is the compound having the basic skeleton of a non-aromatic hydrocarbon (having preferably 2 to 50 carbon atoms) and two or more (preferably 2) maleimide groups in one molecule.

In one embodiment, (E-1-3) the aliphatic maleimide compound is the maleimide compound that is represented, for example, by the formula (E13).

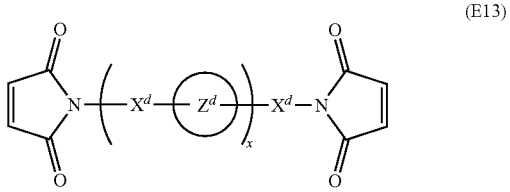

(E13)

In the formula (E13), each $X^d$ independently represents a single bond, an alkylene group, or an alkenylene group (preferably an alkylene group or an alkenylene group); each $Z^d$ independently represents a monocyclic non-aromatic ring optionally having a group selected from an alkyl group and an alkenyl group (preferably a monocycloalkane ring or a monocycloalkene ring optionally having a group selected from an alkyl group and an alkenyl group); and x represents an integer of 0, or 1 or more (preferably an integer of 1 or more, while especially preferably 1). Here, in the formula (E13), the x units may be the same or different in each unit.

Specifically, illustrative examples of (E-1-3) the aliphatic maleimide compound include: linear aliphatic bismaleimide compounds such as N,N'-ethylenedimaleimide, N,N'-tetraethylenedimaleimide, and N,N'-hexamethylenedimaleimide; alicyclic bismaleimide compounds such as 1-maleimide-3-maleimidemethyl-3,5,5-trimethylcyclohexane (IPBM), 1,1'-(cyclohexane-1,3-diylbismethylene) bis(1H-pyrrole-2,5-dione) (CBM), and 1,1'-(4,4'-methylenebis(cyclohexane-4,1-diyl)) bis(1H-pyrrole-2,5-dione) (MBCM); and a bismaleimide having a dimer acid skeleton.

The bismaleimide having a dimer acid skeleton means the bismaleimide compound whose two terminal carboxy groups (—COOH) of a dimer acid are substituted with a maleimide group or a maleimidemethyl group (2,5-dihydro-2,5-dioxo-1H-pyrrol-1-ylmethyl group). The dimer acid is a publicly known compound that can be obtained by dimerization of an unsaturated fatty acid (preferably the one having 11 to 22 carbon atoms, while especially preferably the one having 18 carbon atoms), and the industrial production process thereof has almost been standardized in this industry. The dimer acid especially cheap, readily available, mainly composed of a dimer acid having 36 carbon atoms obtained by dimerization of an unsaturated fatty acid having 18 carbons such as oleic acid and linoleic acid, is readily available. The dimer acid may include arbitrary amounts of a monomer acid, a trimer acid, and other polymer fatty acids, in accordance with the production method, purification level, and so forth. There remains a double bond after polymerization of the unsaturated fatty acid; in this specification, the hydrogenated dimer acid whose unsaturation degree is decreased by a hydrogenation reaction thereafter shall be included in the dimer acid.

The functional group equivalent of the maleimide group in (E-1-3) the aliphatic maleimide compound is preferably in the range of 50 to 2,000 g/eq., more preferably in the range of 100 to 1,000 g/eq., and still more preferably in the range of 200 to 600 g/eq., while especially preferably in the range of 300 to 400 g/eq.

Illustrative examples of the commercially available product of (E-1-3) the aliphatic maleimide compound include "BMI-689", "BMI-1500", "BMI-1700", and "BMI-3000J", manufactured by Designer Molecules Inc.

(E-2) Vinylbenzyl Compound

The vinylbenzyl compound (E-2) is the radically polymerizable compound having a vinylbenzyl group. It is preferable that the vinylbenzyl compound have 2 or more vinylbenzyl groups in one molecule. The vinylbenzyl group is preferably a 4-vinylbenzyl group.

In one embodiment, (E-2) the vinylbenzene compound is the vinylbenzyl-modified polyphenylene ether having the vinylbenzyl group and the polyphenylene ether skeleton. The vinylbenzyl-modified polyphenylene ether having the vinylbenzyl group and the polyphenylene ether skeleton is preferably the vinylbenzyl-modified polyphenylene ether having the repeating unit represented by the following formula (E2a) (number of the repeating unit(s) is preferably 2 to 300, while more preferably 2 to 100) and the vinylbenzyl group, while more preferably the polyphenylene ether whose hydrogen atoms of both the terminal hydroxy groups in the polyphenylene ether are substituted with the vinylbenzyl group.

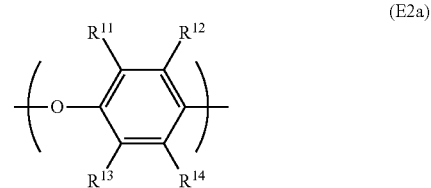

(E2a)

In the formula (E2a), $R^{11}$, $R^{12}$, $R^{13}$, and $R^{14}$ each independently represent a hydrogen atom or a substituent group (preferably a hydrogen atom or an alkyl group, while especially preferably a hydrogen atom or a methyl group).

In another embodiment, (E-2) the vinylbenzyl compound is the vinylbenzene polymer having the repeating unit represented by the following formula (E2b) (number of the repeating unit(s) is preferably 2 to 200).

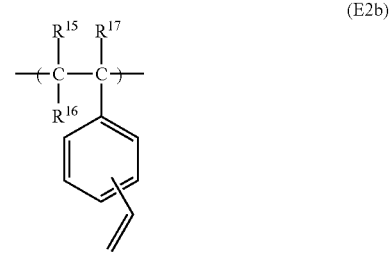

(E2b)

In the formula (E2b), $R^{15}$, $R^{16}$, and $R^{17}$ each independently represent a hydrogen atom or a substituent group (preferably a hydrogen atom).

The vinylbenzene polymer having the repeating unit represented by the formula (E2b) may be the copolymer further having other styrene skeleton unit such as a styrene unit and an ethylstyrene unit. When the polymer has the other styrene skeleton unit, the ratio of the repeating unit represented by the formula (E2b) is preferably 5 to 70% by mol relative to whole of the styrene skeleton unit.

The number-average molecular weight of (E-2) the vinylbenzyl compound is preferably in the range of 500 to 100,000, while more preferably in the range of 700 to 80,000. The functional group equivalent of the vinyl group in (E-2) the vinylbenzyl compound is preferably in the range of 200 to 3,000 g/eq., while more preferably in the range of 200 to 2,000 g/eq.

Illustrative examples of the commercially available product of (E-2) the vinylbenzyl compound include: "OPE-2St", "OPE-2St 1200", and "OPE-2St 2200" (vinylbenzyl-modified polyphenylene ether), manufactured by Mitsubishi Gas Chemical Co. Ltd.; and "ODV-XET-X03", "ODV-XET-X04", and "ODV-XET-X05" (divinylbenzene polymer), manufactured by NIPPON STEEL Chemical & Material Co., Ltd.

(E-3) Radically Polymerizable Compound Other than Maleimide Compound and Vinylbenzyl Compound Illustrative examples of (E-3) the radically polymerizable compound other than the maleimide compound and the vinylbenzyl compound include a (meth)acryl type radically polymerizable compound. The (meth)acryl type radically polymerizable compound is the radically polymerizable compound having an acryloyl group and/or a methacryloyl group. Preferably, the (meth)acryl type radically polymerizable compound has two or more acryloyl groups and/or methacryloyl groups in one molecule thereof. The (meth) acryl type radically polymerizable compound is preferably a (meth)acryl-modified polyphenylene ether having an acryloyl group and/or a methacryloyl group and a polyphenylene ether skeleton. The (meth)acryl type radically polymerizable compound is preferably the (meth)acryl-modified polyphenylene ether having a repeating unit represented by the following formula (E3) (number of the repeating unit(s) is preferably 2 to 300, while more preferably 2 to 100) and an acryloyl group and/or a methacryloyl group.

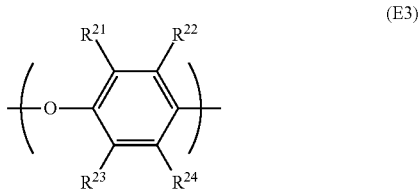

(E3)

In the formula (E3), $R^{21}$, $R^{22}$, $R^{23}$, and $R^{24}$ each independently represent a hydrogen atom or a substituent group (preferably a hydrogen atom or an alkyl group, while especially preferably a hydrogen atom or a methyl group).

The (meth)acryl-modified polyphenylene ether having the repeating unit represented by the formula (E3) and an acryloyl group and/or a methacryloyl group is more preferably the (meth)acryl-modified polyphenylene ether whose hydrogen atoms of both the terminal hydroxy groups in the polyphenylene ether are substituted with an acryloyl group and/or a methacryloyl group.

The number-average molecular weight of the component (E-3) is preferably in the range of 500 to 10,000, while more preferably in the range of 700 to 5,000. The functional group equivalent of the acryloyl group and the methacryloyl group in (E-3) the (meth)acryl type radically polymerizable compound is preferably in the range of 200 to 3,000 g/eq., while more preferably in the range of 300 to 2,000 g/eq.

Illustrative examples of the commercially available product of the component (E-3) include "SA9000" and "SA9000-111" (methacryl-modified polyphenylene ether) manufactured by Sabic Innovative Plastics Inc.

The content of the component (E) in the resin composition is not particularly restricted; the content thereof relative to 100% by mass of the nonvolatile components in the resin composition can be, for example, 25% or less by mass, 20% or less by mass, 15% or less by mass, or 10% or less by mass. In one embodiment, the content of the component (E) is less than the content of the component (C). The lower limit of the component (E) in the resin composition is 0% by mass (namely, this component is not included), and not particularly restricted; the value thereof relative to 100% by mass of the nonvolatile components in the resin composition can be, for example, 0.1% or more by mass, 1% or more by mass, or 2% or more by mass.

(F) Organic Filler

The resin composition according to the present invention may include an organic filler as the component (F). The organic filler (F) may be used singly, or as a combination of two or more kinds arbitrarily.

The organic filler (F) exists as a particle-like form in the resin composition. Illustrative examples of (F) the organic filler include a rubber particle, a polyamide fine particle, and a silicone particle. From a viewpoint to clearly obtain the prescribed effects of the present invention, the rubber particle is preferably used.

Illustrative examples of the rubber component included in the rubber particle include: thermoplastic elastomers including olefin type thermoplastic elastomers such as polybutadiene, polyisoprene, polychlorobutadiene, an ethylene-vinyl acetate copolymer, a styrene-butadiene copolymer, a styrene-isoprene copolymer, a styrene-isobutylene copolymer, an acrylonitrile-butadiene copolymer, an isoprene-isobutylene copolymer, an isobutylene-butadiene copolymer, an ethylene-propylene-diene tercopolymer, and an ethylene-propylene-butene tercopolymer; and acrylic thermoplastic elastomers such as propyl poly(meth)acrylate, butyl poly(meth)acrylate, cyclohexyl poly(meth)acrylate, and octyl poly(meth)acrylate. Among these, the olefin type thermoplastic elastomers are preferable, while the styrene-butadiene copolymer is more preferable. Furthermore, the rubber component may be mixed with a silicone type rubber such as a polyorganosiloxane rubber. The glass transition temperature of the rubber component included in the rubber particle is, for example, 0° C., preferably −10° C. or lower, and more preferably −20° C. or lower, while still more preferably −30° C. or lower.

From a viewpoint to clearly obtain the prescribed effects of the present invention, (F) the organic filler is preferably a core-shell type rubber particle. The core-shell type rubber particle is the particle-like organic filler that is formed of a core particle containing the rubber component mentioned above and a shell portion formed of one or more layers to cover the core particle. Furthermore, the core-shell type particle is preferably the core-shell type graft copolymer rubber particle formed of the core particle including the rubber component mentioned above and the shell portion that is formed by graft-copolymerization of a monomer component copolymerizable with the rubber component included in the core particle. Here, the core-shell type rubber particle includes not only the particle in which the core particle and the shell portion can be clearly distinguishable, but also the particle in which the boundary between the core particle and the shell portion is unclear. The core particle is not necessarily completely covered with the shell portion.

The content of the rubber component in the core-shell type rubber particle is preferably 40% or more by mass, and more preferably 50% or more by mass, while still more preferably 60% or more by mass. The upper limit of the content of the rubber component in the core-shell type rubber particle is not particularly restricted, but from a viewpoint to sufficiently cover the core particle with the shell portion, this value is preferably, for example, 95% or less by mass, or 90% or less.

Illustrative examples of the monomer component that forms the shell portion in the core-shell type rubber particle include: (meth)acrylate esters such as methyl (meth)acrylate, ethyl (meth)acrylate, butyl (meth)acrylate, cyclohexyl (meth)acrylate, octyl (meth)acrylate, and glycidyl (meth)acrylate; (meth)acrylic acid; N-substituted maleimides such as N-methylmaleimide and N-phenylmaleimide; maleimide; α,β-unsaturated carboxylic acids such as maleic acid and itaconic acid; aromatic vinyl compounds such as styrene, 4-vinyltolune, and α-methylstyrene; and (meth)acrylonitrile. Among these, (meth)acrylate esters are preferably included, while methyl (meth)acrylate is more preferably included.

Illustrative examples of the commercially available product of the core-shell type rubber particle include: "CHT" manufactured by Cheil Industries, Inc.; "B602" manufactured by UMGABS, Ltd.; "Paraloid EXL-2602", "Paraloid EXL-2603", "Paraloid EXL-2655", "Paraloid EXL-2311", "Paraloid EXL2313", "Paraloid EXL-2315", "Paraloid KM-330", "Paraloid KM-336P", and "Paraloid KCZ-201", manufactured by Dow Chemical Japan, Ltd.; "Metablen C-223A", "Metablen E-901", "Metablen S-2001", "Metablen W-450A", and "Metablen SRK-200", manufactured by Mitsubishi Rayon Co., Ltd.; and "Kane Ace M-511", "Kane Ace M-600", "Kane Ace M-400", "Kane Ace M-580", and "Kane Ace MR-01", manufactured by Kaneka Corp. The product may be used singly, or as a combination of two or more of them.

The average particle diameter (average primary particle diameter) of (F) the organic filler is not particularly restricted, but this is preferably 20 nm or more, more preferably 50 nm or more, and still more preferably 80 nm or more, while especially preferably 100 nm or more. The upper limit of the average particle diameter (average primary particle diameter) of (F) the organic filler is not particularly restricted, but this value is preferably 5,000 nm or less, more preferably 2,000 nm or less, and still more preferably 1,000 nm or less, while especially preferably 500 nm or less. The average particle diameter (average primary particle diameter) of (F) the organic filler can be measured by using a zeta potential particle size distribution measurement instrument or the like.

The content of the component (F) in the resin composition is not particularly restricted; the content relative to 100% by mass of the nonvolatile components in the resin composition can be, for example, 30% or less by mass, 25% or less by mass, 20% or less by mass, or 15% or less by mass. In one embodiment, the content of the component (F) is less than the content of the component (C). The lower limit of the content of the component (F) in the resin composition is 0% by mass (namely this component is not included), and not particularly restricted. The value thereof relative to 100% by mass of the nonvolatile components in the resin composition can be, for example, 0.1% or more by mass, 1% or more by mass, or 2% or more by mass.

(G) Curing Facilitator

The resin composition according to the present invention may include a curing facilitator as the component (G). The curing facilitator (G) may be used singly, or as a combination of two or more kinds arbitrarily.

Illustrative examples of (G) the curing facilitator include an imidazole type curing facilitator, a phosphorous type curing facilitator, a urea type curing facilitator, a guanidine type curing facilitator, a metal type curing facilitator, and an amine type curing facilitator. In one embodiment, (G) the curing facilitator includes an imidazole type curing facilitator.

Illustrative examples of the imidazole type curing facilitator include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-metylimidazolyl-(1')]-ethyl-s-triazine, a 2,4-diamino-6-[2'-methylimidazolyl-(1')]-ethyl-s-triazine isocyanurate adduct, a 2-phenylimidazole isocyanurate adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and adducts of these imidazole compounds with an epoxy resin.

Commercially available imidazole type curing facilitators may be used. Illustrative examples thereof include "1B2PZ", "2MZA-PW", and "2PHZ-PW", manufactured by Shikoku Chemicals Corp.; and "P200-H50" manufactured by Mitsubishi Chemical Corp.

Illustrative examples of the phosphorous type curing facilitator include: aliphatic phosphonium salts such as tetrabutylphosphonium bromide, tetrabutylphosphonium chloride, tetrabutylphosphonium acetate, tetrabutylphosphonium decanoate, tetrabutylphosphonium laurate, bis(tetrabutylphosphonium) pyromellitate, tetrabutylphosphonium hydrogenhexahydrophthalate, tetrabutylphosphonium 2,6-bis[(2-hydroxy-5-methylphenyl)methyl]-4-methylphenolate, and di-tert-butylmethylphosphonium tetraphenylborate; aromatic phosphonium salts such as methyltriphenylphosphonium bromide, ethyltriphenylphosphonium bromide, propyltriphenylphosphonium bromide, butyltriphenylphosphonium bromide, benzyltriphenylphosphonium chloride, tetraphenylphosphonium bromide, p-tolyltriphenylphosphonium tetra-p-tolylborate, tetraphenylphosphonium tetraphenylborate, tetraphenylphosphonium tetra-p-tolylborate, triphenylethylphosphonium tetraphenylborate, tris(3-methylphenyl)ethylphosphonium tetraphenylborate, tris(2-methoxyphenyl)ethylphosphonium tetraphenylborate, (4-methylphenyl)triphenylphosphonium thiocyanate, tetraphenylphosphonium thiocyanate, and butyltriphenylphosphonium thiocyanate; aromatic phosphine-borane complexes such as triphenylphosphine-triphenylborane; aromatic phosphine-quinone addition reaction products such as a triphenylphosphine-p-benzoquinone addition reaction product; aliphatic phosphines such as tributylphosphine, tri-tert-butylphosphine, trioctylphosphine, di-tert-butyl(2-butenyl)phosphine, di-tert-butyl(3-methyl-2-butenyl)phosphine, and tricyclohexylphosphine; and aromatic phosphines such as dibutylphenylphosphine, di-tert-butylphenylphosphine, methyldiphenylphosphine, ethyldiphenylphosphine, butyldiphenylphosphine, diphenylcyclohexylphosphine, triphenylphosphine, tri-o-tolylphosphine, tri-m-tolylphosphine, tri-p-tolylphosphine, tris(4-ethylphenyl)phosphine, tris(4-propylphenyl)phosphine, tris(4-isopropylphenyl)phosphine, tris(4-butylphenyl)phosphine, tris(4-tert-butylphenyl)phosphine, tris(2,4- dimethylphenyl)phosphine, tris(2,5-dimethylphenyl)phosphine, tris(2,6-dimethylphenyl)phosphine, tris(3,5-dimethylphenyl)phosphine, tris(2,4,6-trimethylphenyl)phosphine, tris(2,6-dimethyl-4-ethoxyphenyl)phosphine, tris(2-methoxyphenyl)phosphine, tris(4-methoxyphenyl)phosphine, tris(4-ethoxyphenyl)phosphine, tris(4-tert-butoxyphenyl)phosphine, diphenyl-2-pyridylphosphine, 1,2-bis(diphenylphosphino)ethane, 1,3-bis(diphenylphosphino)propane, 1,4-bis(diphenylphosphino)butane, 1,2-bis(diphenylphosphino)acetylene, and 2,2'-bis(diphenylphosphino)diphenyl ether.

Illustrative examples of the urea type curing facilitator include: aliphatic dimethylureas such as 1,1-dimethylurea, 1,1,3-trimethylurea, 3-ethyl-1,1-dimethylurea, 3-cyclohexyl-1,1-dimethylurea, and 3-cyclooctyl-1,1-dimethylurea; and aromatic dimethylureas such as 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea, 3-(2-methylphenyl)-1,1-dimethylurea, 3-(4-methylphenyl)-1,1-dimethylurea, 3-(3,4-dimethylphenyl)-1,1-dimethylurea, 3-(4-isopropylphenyl)-1,1-dimethylurea, 3-(4-methoxyphenyl)-1,1-dimethylurea, 3-(4-nitrophenyl)-1,1-dimethylurea, 3-[4-(4-methoxyphenoxy)phenyl]-1,1-dimethylurea, 3-[4-(4-chlorophenoxy)phenyl]-1,1-dimethylurea, 3-[3-(trifluoromethyl)phenyl]-1,1-dimethylurea, N,N-(1,4-phenylene)bis(N',N'-dimethylurea), and N,N-(4-methyl-1,3-phenylene)bis(N',N'-dimethylurea) [toluenebisdimethylurea].

Illustrative examples of the guanidine type curing facilitator include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide.

Illustrative examples of the metal type curing facilitator include organic metal complexes or organic metal salts of metals such as cobalt, copper, zinc, iron, nickel, manganese, and tin. Specifically, illustrative examples of the organic metal complex include organic cobalt complexes such as cobalt (II) acetylacetonate and cobalt (III) acetylacetonate; organic copper complexes such as copper (II) acetylacetonate; organic zinc complexes such as zinc (II) acetylacetonate; organic iron complexes such as iron (III) acetylacetonate; organic nickel complexes such as nickel (II) acetylacetonate; and organic manganese complexes such as manganese (II) acetylacetonate. Illustrative examples of the organic metal salt include zinc octylate, tin octylate, zinc naphthenate, cobalt naphthenate, tin stearate, and zinc stearate.

Illustrative examples of the amine type curing facilitator include: trialkyl amines such as triethylamine and tributylamine; 4-dimethylaminopyridine, benzyl dimethylamine, 2,4,6-tris(dimethylaminomethyl)phenol, and 1,8-diazbicyclo(5,4,0)-undecene.

Commercially available amine type curing facilitators may also be used. Illustrative examples thereof include "MY-25" manufactured by Ajinomoto Fine-Techno Co., Ltd.

The content of the component (G) in the resin composition is not particularly restricted; the content thereof relative to 100% by mass of the nonvolatile components in the resin composition can be, for example, 10% or less by mass, 5% or less by mass, 3% or less by mass, or 1% or less by mass. The lower limit of the content of the component (G) in the resin composition relative to 100% by mass of the nonvolatile components in the resin composition is 0% (namely, this component is not included). From a viewpoint to enhance the prescribed effects of the present invention, the lower limit thereof is 0.001% or more by mass, preferably 0.01% or more by mass, and more preferably 0.05% or more by mass, while still more preferably 0.1% or more by mass.

Other Components

The resin composition according to the present invention may further include an arbitrary additive. Illustrative examples of the additive like this include: thermoplastic resins such as a phenoxy resin, a polyimide resin, a polycarbonate resin, a polyvinyl acetal resin, a polyolefin resin, a polyamideimide resin, a polyetherimide resin, a polysulfone resin, a polyether sulfone resin, a polyphenylene ether resin, a polyether ether ketone resin, a polystyrene resin, and a polyester resin; radical polymerization initiators such as a peroxide type radical polymerization initiator and an azo type radical polymerization initiator; organic metal compounds such as an organic copper compound, an organic zinc compound, and an organic cobalt compound; colorants such as phthalocyanine blue, phthalocyanine green, iodine green, diazo yellow, crystal violet, titanium oxide, and carbon black; polymerization inhibitors such as hydroquinone, catechol, pyrogallol, and phenothiazine; leveling agents such as a silicone type leveling agent and an acrylic polymer type leveling agent; thickeners such as bentone and montmorillonite; antifoaming agents such as a silicone type antifoaming agent, an acryl type antifoaming agent, a fluorine type antifoaming agent, and a vinyl resin type antifoaming agent; UV absorbers such as a benzotriazole type UV absorber; adhesion enhancers such as a urea silane; adhesion assisting agents such as a triazole type adhesion assisting agent, a tetrazole type adhesion assisting agent, and a triazine type adhesion assisting agent; antioxidants such as a hindered phenol type antioxidant and a hindered amine type antioxidant; fluorescent whitening agents such as a stilbene derivative; surfactants such as a fluorine type surfactant and a silicone type surfactant; flame retardants such as phosphorous type flame retardants (for example, phosphate esters, phosphazene compounds, phosphinate compounds, and red phosphorous), nitrogen type flame retardants (for example, melamine sulfate), halogen type flame retardants, and inorganic type flame retardants (for example, antimony trioxide); dispersants such as a phosphate ester type dispersant, a polyoxyalkylene type dispersant, an acetylene type dispersant, a silicone type dispersant, an anionic dispersant, and a cationic dispersant; and stabilizers such as a borate type stabilizer, a titanate type stabilizer, an aluminate type stabilizer, a zirconate type stabilizer, an isocyanate type stabilizer, a carboxylic acid type stabilizer, and a carboxylic anhydride type stabilizer. These additives may be used singly, or as a combination of two or of these additives. The contents of them will be appropriately determined by a person ordinally skilled in the art.

The resin composition may further include, in addition to the non-volatile components described above, an arbitrary organic solvent as a volatile component. Heretofore known solvents may be arbitrarily used as the organic solvent without any particular restriction. Illustrative examples of the organic solvent include: ketone type solvents such as acetone, methyl ethyl ketone, methyl isobutyl ketone, and cyclohexanone; ester type solvents such as methyl acetate, ethyl acetate, butyl acetate, isobutyl acetate, isoamyl acetate, methyl propionate, ethyl propionate, and γ-butyrolactone;

ether type solvents such as tetrahydropyran, tetrahydrofuran, 1,4-dioxane, diethyl ether, diisopropyl ether, dibutyl ether, and diphenyl ether; alcohol type solvents such as methanol, ethanol, propanol, butanol, and ethylene glycol; ether ester type solvents such as 2-ethoxyethyl acetate, propylene glycol monomethyl ether acetate, diethylene glycol monoethyl ether acetate, ethyl diglycol acetate, y-butyrolactone, and methyl methoxypropionate; ester alcohol type solvents such as methyl lactate, ethyl lactate, and methyl 2-hydroxy isobutyrate; ether alcohol type solvents such as 2-methoxy propanol, 2-methoxy ethanol, 2-ethoxy ethanol, propylene glycol monomethyl ether, and diethylene glycol monobutyl ether (butyl carbitol); amide type solvents such as N,N-dimethyl formamide, N,N-dimethyl acetamide, and N-methyl-2-pyrrolidone; sulfoxide type solvents such as dimethyl sulfoxide; nitrile type solvents such as acetonitrile, and propionitrile; aliphatic hydrocarbon type solvents such as hexane, cyclopentane, cyclohexane, and methyl cyclohexane; and aromatic hydrocarbon type solvents such as benzene, toluene, xylene, ethylbenzene, and trimethylbenzene. The organic solvents may be used singly or as a combination of two or more of them.

In the present invention, the resin composition can be produced, for example, by adding into an arbitrary preparation vessel the component (A), the component (B), and the component (C), and optionally the component (D), the component (E), the component (F), the component (G), other additive, and an organic solvent, in an arbitrary order and/or partially or simultaneously all at once, followed by mixing them. During the course of addition and mixing of these components, the temperatures of them may be appropriately controlled; and in addition, they may be heated and/or cooled temporally or throughout the process. During the course of addition and mixing of them or thereafter, the resin composition may be uniformly dispersed by stirring or shaking by using stirring equipment such as a mixer or shaking equipment. Also, simultaneously with stirring or shaking, defoaming may be carried out under a reduced pressure condition such as under a vacuum condition.

As described above, in the epoxy curing system including the component (A) and the component (B), the resin composition according to the present invention including the component (C) gives the cured product with a high yield after patterning. In addition, the cured product of the resin composition according to the present invention has a tendency to have excellent characteristics in dielectric characteristic, heat resistance, and the like. Also, the cured product of the resin composition according to the present invention has a tendency to have low roughness and excellent adhesion to plating (hereinafter, this adhesion is also called "plating adhesion"). Accordingly, the resin composition according to the present invention can realize to provide the cured product (insulating layer) having excellent characteristics, so that this can significantly contribute to today's requirements of high functionalities in the printed wiring board and the semiconductor device.

In one embodiment, the cured product of the resin composition according to the present invention is characterized by a high yield after patterning. For example, when the portion laminated with the resin sheet is observed in accordance with the method in the paragraph of "Assessment of Yield" to be described later, there is no uneven (irregular) portion observed in a portion within 1 cm from the circumference of the portion laminated with the resin sheet. For example, when the cured substrate after desmear treatment (roughening treatment) is observed in accordance with the method in the paragraph of "Assessment of Yield" to be described later, there is no interlayer delamination (crack) observed between the copper layer and the insulating layer. Accordingly, in one more preferred embodiment, there is no uneven (irregular) portion observed nor recognized nor interlayer delamination (crack); the resin composition giving the cured product with a high yield can be provided.

In one embodiment, the cured product of the resin composition according to the present invention tends to have the characteristic that the dielectric characteristic thereof is excellent. For example, the dielectric loss tangent (Df) measured with the method in the paragraph of "Assessment of Dielectric Characteristics" to be described later can be less than 0.003, 0.0025 or less, or 0.0022 or less. Therefore, in one preferred embodiment, the resin composition whose cured product has the dielectric loss tangent of less than 0.003 can be provided. For example, the dielectric constant (Dk) measured with the method in the paragraph of "Assessment of Dielectric Characteristics" to be described later can be 3.0 or more, 3.1 or more, or 3.2 or more. Therefore, in one preferred embodiment, the resin composition whose cured product has the dielectric constant of 3.0 or more can be provided.

In one embodiment, the cured product of the resin composition according to the present invention tends to have the characteristic that the heat resistance thereof is excellent. For example, the glass transition temperature measured with the method (TMA method) in the paragraph of "Assessment of Heat Resistance" to be described later can be 140° C. or higher, 142° C. or higher, 144° C. or higher, 146° C. or higher, or 148° C. or higher. The upper limit thereof can be automatically determined in accordance with the composition and the like of the resin composition. Therefore, in one preferred embodiment, the resin composition whose cured product has the glass transition temperature of 140° C. or higher can be provided. In one more preferred embodiment, the resin composition whose cured product has the dielectric loss tangent of less than 0.003, the dielectric constant of 3.0 or more, and the glass transition temperature of 140° C. or higher can be provided.

In one embodiment, the cured product of the resin composition according to the present invention has the tendency to exhibit the characteristic that the roughness thereof is low. For example, the arithmetic average surface roughness (Ra) measured with the method in the paragraph of "Assessment of Low Roughness" to be described later can be less than 100 nm, 90 nm or less, 80 nm or less, or 60 nm or less. The lower limit thereof can be automatically determined in accordance with the composition and the like of the resin composition.

In one embodiment, the cured product of the resin composition according to the present invention has a tendency to have excellent adhesion to plating. The peel strength measured with the method in the paragraph of "Assessment of Plating Adhesion" to be described later can be 0.40 kgf/cm or more, 0.42 kgf/cm or more, or 0.44 kgf/cm or more. The upper limit thereof can be automatically determined in accordance with the composition and the like of the resin composition.

The resin composition according to the present invention may be preferably used as the resin composition for insulation, especially as the resin composition to form an insulating layer. Specifically, this can be preferably used as the resin composition to form the insulating layer in a printed wiring board (resin composition for insulating layer in printed wiring board), while more preferably as the resin composition to form an interlayer insulating layer in a printed wiring board (interlayer insulating layer of printed wiring board). The resin composition according to the present invention can give an insulating layer having an excellent part-embedding property, so that this can be suitably used also when the printed wiring board is a part-embedded circuit board. The resin composition according to the present invention may also be preferably used as the resin composition to form an insulating layer on which a conductive layer (including redistribution layer) is formed (resin composition for insulating layer to form conductive layer). Furthermore, the resin composition according to the present invention may be used in a wide use range where the resin composition is required. Illustrative examples of these uses include: a sheet lamination material such as a resin sheet and a prepreg; and a solder resist, an underfill material, a die bonding material, a semiconductor sealing material, a hole-filling resin, and a part-embedding resin.

Resin Composition According to the Second Embodiment

The resin composition according to the second embodiment of the present invention is characterized by including (A) the epoxy resin, (B) the epoxy curing agent, and (C') the second specified polyimide resin. The component (C') may be used singly, or a combination of two or more kinds with an arbitrary ratio. In the resin composition according to the second embodiment, the component (A), the component (B), the component (D), the component (E), the component (F), the component (G), the arbitrary additive, and the organic solvent are the same as those of the first embodiment; the explanation of them is omitted.

(C') Second Specified Polyimide Resin

The second specified polyimide resin is the resin including a first skeleton derived from BPADA and a second skeleton derived from BPPAN. The material of the first skeleton is not limited to BPADA as far as the skeleton thereof is the same as the skeleton derived from BPADA. The material of the second skeleton is not limited to BPPAN as far as the skeleton thereof is the same as the skeleton derived from BPPAN. In the second specified polyimide resin, the number of the first skeleton(s) is one or more, and there is no particular restriction in this number; this can be, for example, 100 or less, 50 or less, or 30 or less. In the second specified polyimide resin, the number of the second skeleton(s) is one or more, and there is no particular restriction in this number; this can be, for example, 100 or less, 50 or less, or 30 or less.

The above-mentioned first skeleton and second skeleton may be obtained, for example, by a publicly known production method of a polyimide resin, typically, by the method in which the monomer composition including a tetracarboxylic dianhydride and a diamine compound is polymerized and imidized. The first skeleton and the second skeleton may also be obtained by the method in which the monomer composition including a tetracarboxylic dianhydride and a diisocyanate compound is polymerized and imidized. Therefore, the second specified polyimide resin can include the structural unit (c1) that is included in the first specified polyimide, so that the second embodiment has the same effect as the first embodiment. Here, note that the second specified polyimide resin may partially include a polyamic acid structure that can be formed in the course of imidization.

The second specified polyimide resin may be the resin that further includes a third skeleton that is different from the second skeleton. The third skeleton is the skeleton that is derived from one or more diamine compounds selected from the group consisting of the diamine compounds having an optionally substituted aliphatic group and the diamine compounds having an optionally substituted aromatic group. Therefore, in a certain embodiment, the component (C') is the resin further including the third skeleton, which is different from the second skeleton, and the third skeleton is the skeleton that is derived from one or more diamine compounds selected from the group consisting of the diamine compounds having an optionally substituted aliphatic group and the diamine compounds having an optionally substituted aromatic group. In the second specified polyimide resin, the number of the third skeleton(s) is 0 or more. There is no particular restriction in this number; the number can be 100 or less, 50 or less, or 30 or less.

When the diamine compound is the diamine compound having an aliphatic group, this aliphatic group includes at least a carbon atom, preferably the group formed of one or more skeleton atoms (for example, 1 to 3,000, 1 to 1,000, 1 to 100, or 1 to 50) selected from a carbon atom, an oxygen atom, a nitrogen atom, a sulfur atom, and a silicon atom; this group is more preferably the aliphatic group having 1 to 100 carbon atoms, while still more preferably 1 to 50 carbon atoms. When this aliphatic group has a substituent group, examples of the substituent group are the same as the examples of the substituent group S.

When the diamine compound is the diamine compound having an aromatic group, this aromatic group is preferably the tetravalent aromatic group having 6 to 100 carbon atoms, more preferably 6 to 50 carbon atoms, and still more preferably the tetravalent aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic ring C. When the aromatic group has a substituent group, examples of this substituent group are the same as the examples of the substituent S.

The third skeleton may be the skeleton derived from the diamine compound having an aliphatic group including an alkyl group having 1 to 6 carbon atoms as the substituent group thereof. The third skeleton may be the skeleton derived from isophoronediamine either. Accordingly, in a certain embodiment, the component (C') is the resin further including the skeleton derived from the diamine compound having the aliphatic group including the alkyl group having 1 to 6 carbon atoms as the substituent group thereof. Specifically, the third skeleton is, for example, the skeleton derived from isophoronediamine. The skeleton derived from isophoronediamine (5-amino-1,3,3-trimethylcyclohexanemethylamine) may also be the skeleton derived from 5-isocyanate-1-(isocyanatemethyl)-1,3,3-trimethylcyclohexane.

The third skeleton may also be the skeleton derived from one or more compounds selected from the diamine compounds having an optionally substituted aromatic group, such as 4,4'-diaminodiphenyl ether, 1,4-phenylenediamine, and 2,2-bis[4-(4-aminophenoxy)phenyl]propane. The third skeleton like this is characterized by having an aromatic group.

The third skeleton may also be the skeleton derived from one or more compounds selected from the diamine compounds having an optionally substituted aliphatic group, such as 1,2-diaminoethane, 1,3-diaminopropane, 1,4-diaminobutane, 1,5-diaminopentane, 1,6-hexanediamine, 1,7-heptanediamine, 1,8-octanediamine, 1,9-nonanediamine, 1,10-decanediamine, 1,11-undecanediamine, and 1,12-dodecanediamine. The third skeleton like this is characterized by the aliphatic groups therein being of a linear type.

The third skeleton may also be the skeleton derived from one or more compounds selected from the diamine compounds having an optionally substituted aliphatic group, such as 1,2-diaminopropane, 1,2-diamino-2-methylpropane, 1,3-diamino-2-methylpropane, 1,3-diamino-2,2-dimethylpropane, 1,3-diaminopentane, and 1,5-diamino-2-methylpentane. The third skeleton like this is characterized by the aliphatic groups therein being of a branched type.

The third skeleton may also be the skeleton derived from one or more compounds selected from the diamine compounds having an optionally substituted aliphatic group, such as 5-amino-1,3,3-trimethylcyclohexanemethylamine (isophoronediamine), 1,4-diaminocyclohexane, 1,3-diaminocyclohexane, 1,4-cyclohexane bis(methylamine), 1,3-cyclohexane bis(methylamine), 4,4'-diaminodicyclohexylmethane bis(4-amino-3-methylcyclohexyl)methane, 3(4),8 (9)-bis(aminomethyl)tricyclo[5.2.1.0$^{21}$,]decane, 2,5(6)-bis(aminomethyl)bicyclo[2.2.1]heptane, 1,3-diaminoadamantane, 3,3'-diamino-1,1'-biadamantyl, and 1,6-diaminoadamantane. The third skeleton like this is characterized by the aliphatic group therein including an alicyclic carbon ring.

The above-mentioned third skeleton may be generated in the second polyimide resin, for example, by the method as follows. Namely, in the method to polymerize and imidize the monomer composition including a tetracarboxylic dianhydride, which is capable of becoming the first skeleton material, and a diamine compound, which is capable of becoming the second skeleton material, a diamine compound or a diisocyanate compound, which is capable of becoming the third skeleton, is caused to be included in the monomer composition, or successively mixed during polymerization. Therefore, the second specified polyimide resin can include the structural unit (c2) that can be included in the first specified polyimide resin. Here, note that the second specified polyimide resin may partially include a polyamic acid structure that can be formed in the course of imidization.

Also, the second specified polyimide resin may be the resin further including a fourth skeleton that is different from the first skeleton. The fourth skeleton is the skeleton derived from one or more acids selected from the group consisting of the acids other than BPADA. In the second specified polyimide resin, the number of the fourth skeleton(s) is 0 or more, and not particularly restricted; this can be 100 or less, 50 or less, or 30 or less.

Illustrative examples of the acid other than BPADA include a tetracarboxylic dianhydride having an optionally substituted aromatic group. This aromatic group is preferably the aromatic group having 6 to 100 carbon atoms, more preferably 6 to 50 carbon atoms, and still more preferably the aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic ring C. When the aromatic group has a substituent group, examples of this substituent group are the same as the examples of the substituent S. Specifically, illustrative examples of the tetracarboxylic dianhydride having an optionally substituted aromatic group include pyromellitic dianhydride, 3,3',4,4'-biphenyltetracarboxylic dianhydride, 4,4'-oxydiphthalic anhydride, 3,3',4,4'-benzophenonetetracarboxylic dianhydride, and 3,3',4,4'-diphenylsulfonetetracarboxylic dianhydride.

The glass transition temperature $Tg^{(C')}$ (° C.) of the component (C') is preferably 140° C. or higher, more preferably 145° C. or higher, still more preferably 150° C. or higher, and yet more preferably 160° C. or higher, while especially preferably 170° C. or higher. The upper limit thereof is not particularly restricted; this can be 300° C. or lower, or the like. The glass transition temperature $Tg^{(C')}$ (° C.) can be measured by the same method as the method in "Assessment of Heat Resistance" to be described later.

From a viewpoint to enhance the prescribed effects of the present invention, the total content ratio (percentage) of the first skeleton and the second skeleton in the component (C') is preferably 4% or more by mass, more preferably 9% or more by mass, still more preferably 19% or more by mass, and yet more preferably 29% or more by mass, while especially preferably 39% or more by mass. The total content ratio (percentage) of the first skeleton and the second skeleton can be, for example, 97% or less by mass, 94% or less by mass, 89% or less by mass, or 84% or less by mass. Here, the total content ratio (percentage) of the first skeleton and the second skeleton may be calculated from the ratio of the charging amount (parts by mass), which contributes to the reaction, of each of the materials that are used for synthesis of the component (C'). Alternatively, after the molecular weight of the component (C') and the formula weights of the first skeleton and the second skeleton that are included in the resin are determined, the total content ratio may be calculated as the ratio thereof to the molecular weight of the total formula weights of the first skeleton and the second skeleton. When the component (C') is a polymer, the total content ratio (percentage) of the first skeleton and the second skeleton, estimated from the polymerization degree, is preferably within the range described above.

When the component (C') is the resin further including the third skeleton, the content ratio (percentage) of the third skeleton may be 0% by mass (namely, the third skeleton is not included), in which the upper limit thereof is not restricted as far as the advantageous effects of the present invention is excessively impaired. Therefore, the content ratio (percentage) of the third skeleton in the component (C') can be, for example, more than 0% by mass, 4% or more by mass, 9% or more by mass, 19% or more by mass, or 29% or more by mass, and 94% or less by mass, 89% or less by mass, 79% or less by mass, 69% or less by mass, or 59% or less by mass. Here, the content ratio (percentage) of the third skeleton may be calculated by the same way as the content ratio (percentage) of the first skeleton and the content ratio (percentage) of the second skeleton. When the component (C') is a polymer, the content ratio (percentage) of the third skeleton, estimated from the polymerization degree, is preferably within the range described above. When the component (C') is the resin including a fourth skeleton, the content ratio (percentage) of the fourth skeleton is the same as the content ratio (percentage) of the third skeleton.

As far as the component (C') is the resin that includes the first skeleton derived from BPADA and the second skeleton derived from BPPAN, the terminal structure thereof is not particularly restricted. For example, the terminal structure of the component (C') may be an acid anhydride group, a carboxy group, or an amino group derived from the raw material compounds of the component (C') (for example, an acid such as BPADA or an amine compound such as BPPAN). When maleic anhydride is further included in the raw material compound, the terminal structure of the component (C') may be the maleimide group.

The weight-average molecular weight (Mw) of the component (C') is 1,000 or more, preferably in the range of 1,000 to 10,000, and more preferably in the range of 1,000 to 5,000, while still more preferably in the range of 1,000 to 3,000. The weight-average molecular weight of the resin can be measured in terms of polystyrene by a gel permeation chromatography (GPC) method.

The content of the component (C') in the resin composition is not particularly restricted, but from a viewpoint to enhance the prescribed effects of the present invention, the content thereof relative to 100% by mass of the nonvolatile components in the resin composition is preferably 0.01% or more by mass, and more preferably 0.1% or more by mass, while still more preferably 0.3% or more by mass, 0.4% or more by mass, 0.5% or more by mass, 0.6% or more by mass, or 0.7% or more by mass. The upper limit of the component (C') in the resin composition is not particularly restricted; the value thereof relative to 100% by mass of the nonvolatile components in the resin composition can be, for example, 30% or less by mass, 20% or less by mass, 15% or less by mass, or 10% or less by mass. Accordingly, in one preferred embodiment, the content of the component (C') relative to 100% by mass of the nonvolatile components in the resin composition is in the range of 0.01 to 30% by mass.

The content of the component (C') in the resin composition is not particularly restricted, but from a viewpoint to enhance the prescribed effects of the present invention, the content thereof relative to 100% by mass of the resin components in the resin composition is preferably 0.03% or more by mass, and more preferably 0.3% or more by mass, while still more preferably 0.9% or more by mass, 1.2% or more by mass, 1.5% or more by mass, 1.8% or more by mass, or 2.1% or more by mass. The upper limit of the component (C') in the resin composition is not particularly restricted; the value thereof relative to 100% by mass of the resin components in the resin composition can be, for example, 50% or less by mass, 40% or less by mass, 35% or less by mass, or 30% or less by mass. The resin components in the resin composition means the nonvolatile components in the resin composition except for (D) the inorganic filler described before.

Resin Composition According to the Third Embodiment

The resin composition according to the third embodiment of the present invention is characterized by including (A) the epoxy resin, (B) the epoxy curing agent, and (C") the third specified polyimide resin. The component (C") may be used singly, or a combination of two or more kinds with an arbitrary ratio. In the resin composition according to the third embodiment, the component (A), the component (B), the component (D), the component (E), the component (F), the component (G), the arbitrary additive, and the organic solvent are the same as those of the first embodiment; so, the explanation of them is omitted.

(C") Third Specified Polyimide Resin

The resin composition according to the third embodiment of the present invention includes the third specified polyimide resin as the component (C"). As can be seen in Examples to be described later, the resin composition according to the third embodiment of the present invention can express the prescribed effects of the present invention when the component (C") is included in the epoxy curing system.

The third specified polyimide resin is the resin that is obtained by polymerizing and imidizing the monomer composition containing at least BPADA and BPPAN. There is no particular restriction in polymerization and imidization, but this is usually carried out in a solvent. At the time of polymerization, the mixing ratio of BPADA and BPPAN is determined preferably in accordance with the total number of the functional groups possessed by each component. In one embodiment, the ratio of the total number of the amino groups possessed by BPPAN to the total number of the acid anhydride groups possessed by BPADA in the monomer composition is in the range of 0.1:1 to 10:1, preferably in the range of 0.5:1 to 10:1, and more preferably in the range of 0.8:1 to 10:1, while still more preferably in the range of 0.9:1 to 10:1. There is no particular restriction in imidization, but in general this is carried out in a solvent with heating in the absence of a catalyst, by heating in the presence of a catalyst, or in the presence of a catalyst at room temperature. From a viewpoint to enhance the prescribed effects of the present invention, it is preferable that the imidization be carried out by heating in the absence of a catalyst. The third specified polyimide may be any of a random copolymer, an alternating copolymer, and a block copolymer. The production method of the third specified polyimide resin is not limited to the polymerization and imidization described above. Here, note that the third specified polyimide resin may partially include a polyamic acid structure that can be formed in the course of imidization. The third specified polyimide resin obtained as described above includes the structural unit (c1) that is included in the first specified polyimide, so that the third embodiment has the same effect as the first embodiment. Also, the third specified polyimide resin obtained as described above includes the first skeleton and the second skeleton that are included in the second specified polyimide, so that the third embodiment has the same effect as the second embodiment.

The above-mentioned monomer composition may include, as the other monomer, an acid other than BPADA and/or a diamine other than BPPAN; alternatively, the other monomer may be added during the reaction.

Illustrative examples of the acid other than BPADA include a tetracarboxylic dianhydride having an optionally substituted aromatic group. This aromatic group is preferably the tetravalent aromatic group having 6 to 100 carbon atoms, more preferably 6 to 50 carbon atoms, and still more preferably the tetravalent aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic ring C. When the aromatic group has a substituent group, examples of this substituent group are the same as the examples of the substituent S. Specifically, illustrative examples of the tetracarboxylic dianhydride having an optionally substituted aromatic group include pyromellitic dianhydride, 3,3',4,4'-biphenyltetracarboxylic dianhydride, 4,4'-oxydiphthalic anhydride, 3,3',4,4'-benzophenonetetracarboxylic dianhydride, and 3,3'4,4'-diphenylsulfonetetracarboxylic dianhydride. The mole ratio of the acid content other than BPADA to the BPADA content in the monomer composition is not particularly restricted; for example, this can be 0.5 or less, 0.4 or less, or 0.3 or less.

In a certain embodiment, the monomer composition further includes one or more diamine compounds selected from the group consisting of the diamine compounds having an optionally substituted aliphatic group and the diamine compounds having an optionally substituted aromatic group. The mole ratio of the content of the diamine compound other than BPPAN to the BPPAN content in the monomer composition is not particularly restricted; for example, this can be 0.5 or less, 0.4 or less, or 0.3 or less.

When the diamine compound is the diamine compound having an aliphatic group, this aliphatic group includes at least a carbon atom, preferably the group formed of one or more skeleton atoms (for example, 1 to 3,000, 1 to 1,000, 1 to 100, or 1 to 50) selected from a carbon atom, an oxygen atom, a nitrogen atom, a sulfur atom, and a silicon atom; this group is more preferably the aliphatic group having 1 to 100 carbon atoms, while still more preferably 1 to 50 carbon atoms. When this aliphatic group has a substituent group, examples of the substituent group are the same as the examples of the substituent group S.

When the diamine compound is the diamine compound having an aromatic group, this aromatic group is preferably the tetravalent aromatic group having 6 to 100 carbon atoms, more preferably 6 to 50 carbon atoms, and still more preferably the tetravalent aromatic carbon group having 6 to 100 carbon atoms, while yet more preferably 6 to 50 carbon atoms. The aromatic group includes at least an aromatic ring. Examples of the aromatic ring included in the aromatic group are the same as the examples of the aromatic ring C. When the aromatic group has a substituent group, examples of this substituent group are the same as the examples of the substituent S. When the diamine compound is the diamine compound having an optionally substituted aromatic group, the example thereof may be one or more compounds selected from the diamine compounds having the aromatic group, such as 4,4'-diaminodiphenyl ether, 1,4-phenylenediamine, and 2,2-bis[4-(4-aminophenoxy)phenyl]propane.

When the diamine compound is the diamine compound having an optionally substituted aliphatic group, the first example thereof may be the skeleton derived from one or more compounds selected from the diamine compounds having an optionally substituted aliphatic group, such as 1,2-diaminoethane, 1,3-diaminopropane, 1,4-diaminobutane, 1,5-diaminopentane, 1,6-hexanediamine, 1,7-heptanediamine, 1,8-octanediamine, 1,9-nonanediamine, 1,10-decanediamine, 1,11-undecanediamine, and 1,12-dodecanediamine. The diamine compounds according to this first example are characterized by the aliphatic groups therein being of a linear type.

When the diamine compound is the diamine compound having an optionally substituted aliphatic group, the second example thereof may be the skeleton derived from one or more compounds selected from the diamine compounds having an optionally substituted aliphatic group, such as 1,2-diaminopropane, 1,2-diamino-2-methylpropane, 1,3-diamino-2-methylpropane, 1,3-diamino-2,2-dimethylpropane, 1,3-diaminopentane, and 1,5-diamino-2-methylpentane. The diamine compounds according to this second example are characterized by the aliphatic groups therein being of a branched type.

When the diamine compound is the diamine compound having an optionally substituted aliphatic group, the third example thereof may be the skeleton derived from one or more compounds selected from the diamine compounds having an optionally substituted aliphatic group, such as 5-amino-1,3,3-trimethylcyclohexanemethylamine (isophoronediamine), 1,4-diaminocyclohexane, 1,3-diaminocyclohexane, 1,4-cyclohexane bis(methylamine), 1,3-cyclohexane bis(methylamine), 4,4'-diaminodicyclohexylmethane, bis(4-amino-3-methylcyclohexyl)methane, 3(4),8(9)-bis(aminomethyl)tricyclo[5.2.1.0$^2$,]decane, 2,5(6)-bis(aminomethyl)bicyclo[2.2.1]heptane, 1,3-diaminoadamantane, 3,3'-diamino-1,1'-biadamantyl, and 1,6-diaminoadamantane. The diamine compounds according to this third example are characterized by the aliphatic groups including alicyclic carbon rings.

Accordingly, in a certain embodiment, the monomer composition further includes the diamine compound having an aliphatic group including as the substituent thereof an alkyl group having 1 to 6 carbon atoms. In the specified embodiment, the monomer composition further includes isophoronediamine.

As far as the component (C") is the resin that is obtained by polymerizing and imidizing the above-mentioned monomer composition, the terminal structure thereof is not particularly restricted. For example, the terminal structure of the component (C") may be an acid anhydride group, a carboxy group, or an amino group derived from the raw material compounds included in the monomer composition of the component (C") (for example, an acid such as BPADA or an amine compound such as BPPAN). When maleic anhydride is further included in the raw material compound, the terminal structure of the component (C") may be the maleimide group.

The weight-average molecular weight (Mw) of the component (C") is 1,000 or more, preferably in the range of 1,000 to 10,000, and more preferably in the range of 1,000 to 5,000, while still more preferably in the range of 1,000 to 3,000. The weight-average molecular weight of the resin can be measured in terms of polystyrene by a gel permeation chromatography (GPC) method.

The content of the component (C") in the resin composition is not particularly restricted, but from a viewpoint to enhance the prescribed effects of the present invention, the content thereof relative to 100% by mass of the nonvolatile components in the resin composition is preferably 0.01% or more by mass, and more preferably 0.1% or more by mass, while still more preferably 0.3% or more by mass, 0.4% or more by mass, 0.5% or more by mass, 0.6% or more by mass, or 0.7% or more by mass. The upper limit of the component (C") in the resin composition is not particularly restricted; the value thereof relative to 100% by mass of the nonvolatile components in the resin composition can be, for example, 30% or less by mass, 20% or less by mass, 15% or less by mass, or 10% or less by mass. Accordingly, in one preferred embodiment, the content of the component (C") relative to 100% by mass of the nonvolatile components in the resin composition is in the range of 0.01 to 30% by mass.

The content of the component (C") in the resin composition is not particularly restricted, but from a viewpoint to enhance the prescribed effects of the present invention, the content thereof relative to 100% by mass of the resin components in the resin composition is preferably 0.03% or more by mass, and more preferably 0.3% or more by mass, while still more preferably 0.9% or more by mass, 1.2% or more by mass, 1.5% or more by mass, 1.8% or more by mass, or 2.1% or more by mass. The upper limit of the component (C") in the resin composition is not particularly restricted; the value thereof relative to 100% by mass of the resin components in the resin composition can be, for example, 50% or less by mass, 40% or less by mass, 35% or less by mass, or 30% or less by mass. The resin components in the resin composition means the nonvolatile components in the resin composition except for (D) the inorganic filler described before.

Resin Sheet

Although the resin composition according to the present invention may also be used in a varnish state so as to be applied, industrially, in general, it is preferable to use this in the form of a sheet lamination material containing the resin composition.

The sheet lamination material is preferably a resin sheet and a prepreg as described below.

In one embodiment, the resin sheet is formed of a supporting body (support) and a layer of the resin composition that is formed on this supporting body (hereinafter, this resin layer is simply called "resin composition layer"). Here, the resin composition layer is characterized by being formed of the resin composition according to the present invention.

In view of the thinning of a printed wiring board, and providing a cured product having a superior insulating property even if the cured product of this resin composition is a thin film, the thickness of the resin composition layer is preferably 100 µm or less, while more preferably 60 µm or less. The lower limit of the thickness of the resin composition layer is not particularly restricted, and it can be usually 5 µm or more, 10 µm or more, or the like.

Illustrative examples of the supporting body include a film formed of a plastic material, metal foil, and a releasing paper. Among them, a film formed of a plastic material and metal foil are preferable.

When a film formed of a plastic material is used as the supporting body, illustrative examples of the plastic material include: polyesters such as polyethylene terephthalate (PET) and polyethylene naphthalate (PEN); polycarbonate (PC); acrylics such as polymethyl methacrylate (PMMA); cyclic polyolefin, triacetyl cellulose (TAC), polyether sulfide (PES), polyether ketone, and polyimide. Among these, polyethylene terephthalate and polyethylene naphthalate are preferable, while inexpensive polyethylene terephthalate is especially preferable.

In the case that metal foil is used as the supporting body, illustrative examples of the metal foil include copper foil and aluminum foil, and copper foil is preferable. As to the copper foil, the foil formed of a copper single metal or an alloy of copper with other metal (for example, tin, chromium, silver, magnesium, nickel, zirconium, silicon, titanium, and the like) may be used.

The supporting body may be subjected to a mat treatment, a corona treatment, or an antistatic treatment on the surface to be bonded with the resin composition layer. As to the supporting body, a releasing layer-attached supporting body having a releasing layer on the surface to be bonded with the resin composition layer may be used. The releasing agent to be used in the releasing layer of the releasing layer-attached supporting body may be one or more releasing agents selected from the group consisting of, for example, an alkyd resin, a polyolefin resin, a urethane resin, and a silicone resin. A commercially available good may also be used as the releasing layer-attached supporting body. Illustrative examples thereof include a PET film having a releasing layer mainly formed of an alkyd resin type releasing agent, such as "SK-1", "AL-5", and "AL-7" manufactured by Lintech Corp.; "Lumirror T60" manufactured by Toray Industries; "Purex" manufactured by Teijin Ltd.; and "Unipeel" manufactured by Unitika Ltd.

The thickness of the supporting body is not particularly restricted, and it is preferably in the range of 5 to 75 µm, while more preferably in the range of 10 to 60 µm. When the releasing layer-attached supporting body is used, total thickness of the releasing layer-attached supporting body is preferably within this range.

As for the supporting body, metal foil attached with a supporting substrate in which thin metal foil adheres to the supporting substrate that is peelable may also be used. In one embodiment, the metal foil attached with the supporting substrate includes the supporting substrate, a releasing layer formed on the supporting substrate, and the metal foil formed on the releasing layer. When the metal foil attached with the supporting substrate is used as the supporting body, the resin composition layer is formed on the metal foil.

In the metal foil attached with the supporting substrate, the material of the supporting substrate is not particularly restricted. Illustrative examples thereof include copper foil, aluminum foil, stainless steel foil, titanium foil, and copper alloy foil. When the copper foil is used as the supporting substrate, this may be electrolytic copper foil or rolled copper foil. The releasing layer is not particularly restricted so far as the metal foil can be removed from the supporting substrate; illustrative examples thereof include: an alloy layer of the element selected from the group consisting of Cr, Ni, Co, Fe, Mo, Ti, W, and P; and an organic coat film.

In the metal foil attached with the supporting substrate, the material of the metal foil is preferably, for example, the copper foil and the copper alloy foil.

In the metal foil attached with the supporting substrate, although the thickness of the supporting substrate is not particularly restricted, this is preferably in the range of 10 to 150 µm, while more preferably in the range of 10 to 100 µm. The thickness of the metal foil may be made, for example, in the range of 0.1 to 10 µm.

In one embodiment, the resin sheet may further include an arbitrary layer, if necessary. The arbitrary layer may be, for example, among others, a protection film or the like formed on the surface of the resin composition layer not bonded with the supporting body (namely, the surface opposite to the supporting body). The thickness of the protection film is not particularly restricted, and it is, for example, in the range of 1 to 40 µm. By providing the protection film, the resin composition layer may be prevented from attachment of dirt and the like as well as from a scar on the surface thereof.

The resin sheet may be produced, for example, as follows. The resin composition in a liquid state as it is, or a resin varnish prepared by dissolving the resin composition into an organic solvent is applied onto a supporting body by means of a die coater or the like; and then, this is dried to form the resin composition layer.

Organic solvents the same as those explained as the component in the resin composition may be used. These organic solvents may be used singly or as a combination of two or more of them.

Drying may be carried out by a heretofore known method such as heating, and blowing of a hot air. The drying condition is not particularly restricted. Drying is carried out so as to bring the content of the organic solvent in the resin composition layer to 10% by mass or less, while preferably to 5% by mass or less. In the case that the resin composition containing an organic solvent with the amount, for example, in the range of 30 to 60% by mass, or the resin varnish containing an organic solvent with the same amount is used, the resin composition layer may be formed by drying thereof at 50 to 150° C. for 3 to 10 minutes, although these conditions are different depending on the boiling point of the organic solvent contained in the resin composition or in the resin varnish.

The resin sheet can be rolled up so as to be stored. In the case that the resin sheet has the protection film, the resin sheet can be used after the protection film is removed.

In one embodiment, a prepreg is formed by impregnating a sheet-like fibrous substrate with the resin composition according to the present invention.

The sheet-like fibrous substrate to be used in the prepreg is not particularly restricted. Those usually used as the substrate for a prepreg, such as a glass cloth, an aramid unwoven cloth, and a liquid crystal polymer unwoven cloth may be used. In view of the thinning of a printed wiring board, the thickness of the sheet-like fibrous substrate is preferably 50 µm or less, more preferably 40 µm or less, and still more preferably 30 µm or less, while especially preferably 20 µm or less. The lower limit of the thickness of the sheet-like fibrous substrate is not particularly restricted. Usually, the thickness thereof is 10 µm or more.

The prepreg can be produced by a heretofore known method such as a hot melt method, and a solvent method.

The thickness of the prepreg can be made within the same range as that of the resin composition layer in the resin sheet described above.

The sheet lamination material according to the present invention may be preferably used to form an insulating layer in a printed wiring board (a material for an insulating layer in a printed wiring board), while more preferably to form an interlayer insulating layer in a printed wiring board (a material for an interlayer insulating layer in a printed wiring board).

Printed Wiring Board

The printed wiring board according to the present invention includes an insulating layer formed of a cured product of the resin composition according to the present invention.

The printed wiring board can be produced, for example, by using the resin sheet described above by a method including following processes (I) and (II):
- (I) process to laminate a resin sheet on an inner layer substrate so as to bond a resin composition layer of the resin sheet with the inner layer substrate, and
- (II) process to cure the resin composition layer (for example, thermal cure) thereby forming an insulating layer.

Thus, a method for producing a printed wiring board according to the present invention, comprises at least one step of forming an insulating layer of the printed wiring board by using the resin composition or the resin sheet as described above.

"Inner layer substrate" used in the process (I) is a component to become a substrate of a printed wiring board; and illustrative examples thereof include a glass epoxy substrate, a metal substrate, a polyester substrate, a polyimide substrate, a BT resin substrate, and a thermosetting polyphenylene ether substrate. This substrate may have a conductive layer on one side or both sides thereof; and this conductive layer may be pattern-processed. The inner layer substrate having a conductive layer (circuit) on one side or both sides of the substrate may also be called "inner layer circuit substrate". An intermediate product with which an insulating layer and/or a conductive layer is to be formed at the time of producing a printed wiring board is also included in the "inner layer substrate" according to the present invention. When the printed wiring board is a component-incorporated circuit board, an inner substrate incorporated with the component may be used.

Lamination of the resin sheet to the inner layer substrate may be carried out, for example, by hot-press adhesion of the resin sheet to the inner layer substrate from the supporting body side thereof. Illustrative examples of the component for hot-press adhesion of the resin sheet to the inner layer substrate (hereinafter, this component is also called "hot-pressing component") include a heated metal plate (a SUS mirror plate and the like) and a heated metal roll (a SUS roll). At this time, the resin sheet may be pressed directly by the hot-pressing component or via an elastic material such as a heat-resistant rubber so that the resin sheet may sufficiently follow the surface irregularity of the inner layer substrate.

Lamination of the resin sheet to the inner layer substrate may be carried out by a vacuum lamination method. In the vacuum lamination method, the temperature of the hot-press adhesion is preferably in the range of 60 to 160° C., while more preferably in the range of 80 to 140° C. The pressure of the hot-press adhesion is preferably in the range of 0.098 to 1.77 MPa, while more preferably in the range of 0.29 to 1.47 MPa. The period of the hot-press adhesion is preferably in the range of 20 to 400 seconds, while more preferably in the range of 30 to 300 seconds. The lamination can be carried out under evacuated condition of preferably 26.7 hPa or less of the pressure.

Lamination may be carried out by using a commercially available vacuum laminator. Illustrative examples of the commercially available vacuum laminator include a vacuum press type laminator manufactured by Meiki Co., Ltd., and a vacuum applicator and a batch type vacuum press laminator, both being manufactured by Nikko-Materials Co., Ltd.

After the lamination, for example, the laminated resin sheet may be flattened by pressing the hot-pressing component from the side of the supporting body thereof under a normal pressure (under an atmospheric pressure). The pressing conditions of the flattening process can be made as same as the hot-press adhesion conditions in the before-mentioned lamination. The flattening process may be carried out by using a commercially available laminator. The lamination and the flattening processes may be carried out continuously by using the commercially available vacuum laminator described above.

The supporting body may be removed between the process (I) and the process (II), or after the process (II). When the metal foil is used as the supporting body, a conductive layer may be formed by using the metal foil without removing the supporting body. When the metal foil attached with the supporting substrate is used as the supporting body, the supporting substrate (and the releasing layer) may be removed. Then, the conductive layer may be formed by using the metal foil.

In the process (II), the resin composition layer is cured (for example, thermally cured) to form an insulating layer formed of a cured product of the resin composition. Curing conditions of the resin composition layer are not particularly restricted, so that the conditions usually used to form an insulating layer of a printed wiring board may be used.

Thermosetting conditions of the resin composition layer are different depending on the resin composition and the like. For example, in one embodiment, the curing temperature is preferably in the range of 120 to 250° C., and more preferably in the range of 130 to 240° C., while still more preferably in the range of 140 to 230° C. The curing period can be preferably in the range of 5 to 240 minutes, and more preferably in the range of 10 to 150 minutes, while still more preferably in the range of 15 to 120 minutes.

Before the resin composition layer is thermally cured, the resin composition layer may be pre-heated at the temperature lower than the curing temperature. For example, prior to thermally curing the resin composition layer, the resin composition layer may be pre-heated in the temperature range of 50 to 120° C., and preferably in the range of 60 to 115° C., while more preferably in the range of 70 to 110° C., and for the period of 5 minutes or longer, preferably in the range of 5 to 150 minutes, and more preferably in the range of 15 to 120 minutes, while still more preferably in the range of 15 to 100 minutes.

In production of the printed wiring board, a process (III) to make a hole in the insulating layer, a process (IV) to roughen the insulating layer, and a process (V) to form a conductive layer may be further carried out. The processes from (III) to (V) may be carried out in accordance with various methods heretofore known to a person ordinarily skilled in the art in production of a printed wiring board. In the case that the supporting body is removed after the process (II), removal of the supporting body may be carried out between the process (II) and the process (III), or between the process (III) and the process (IV), or between the process (IV) and the process (V). As needed, processes (I) to (V), i.e., formation of the insulating layer and the conductive layer, may be repeated to form a multilayer wiring board.

In other embodiment, the printed wiring board according to the present invention can be produced by using the above-mentioned prepreg. The production method thereof is basically the same as the production method of the resin sheet.

In the process (III), a hole is created in the insulating layer. With this, a hole such as a via hole, and a through hole can be formed in the insulating layer. The process (III) may be carried out by using, for example, a drill, a laser, a plasma, or the like in accordance with composition and the like of the resin composition used to form the insulating layer. The size and shape of the hole may be arbitrarily determined in accordance with a design of the printed wiring board.

In the process (IV), the insulating layer is roughened. Usually, in the process (IV), a smear is removed as well. The procedure and condition of the roughening process are not particularly restricted, so that heretofore known procedure and condition usually used to form an insulating layer of a printed wiring board can be used. The roughening process of the insulating layer may be carried out, for example, by a method in which a swelling treatment with a swelling liquid, a roughening treatment with an oxidant, and a neutralizing treatment with a neutralizing solution are carried out in this order.

The swelling liquid to be used in the roughening process is not particularly restricted, and illustrative examples of the swelling liquid include an alkaline solution and a surfactant solution. Among them, an alkaline solution is preferable, while a sodium hydroxide solution and a potassium hydroxide solution are more preferable as the alkaline solution. Illustrative examples of the swelling liquid that is commercially available include "Swelling Dip Securiganth P" and "Swelling Dip Securiganth SBU", both being manufactured by Atotech Japan Co., Ltd. The swelling treatment with the swelling liquid is not particularly restricted, and for example, can be carried out by soaking the insulating layer into the swelling liquid in the temperature range of 30 to 90° C. and for the period of 1 to 20 minutes. In view of suppressing the swelling of the resin in the insulating layer to a suitable level, it is preferable to soak the insulating layer into the swelling liquid in the temperature range of 40 to 80° C. and for the period of 5 to 15 minutes.

Oxidant to be used in the roughening process is not particularly restricted, and illustrative examples of the oxidant include an alkaline permanganate solution having potassium permanganate or sodium permanganate dissolved into a sodium hydroxide aqueous solution. The roughening process with an oxidant such as the alkaline permanganate solution may be carried out preferably by soaking the insulating layer into the oxidant solution heated to 60 to 100° C. for the period of 10 to 30 minutes. The concentration of the permanganate salt in the alkaline permanganate solution is preferably in the range of 5 to 10% by mass. Illustrative examples of the oxidant that is commercially available include alkaline permanganate solutions such as "Concentrate Compact CP", and "Dosing Solution Securiganth P", both being manufactured by Atotech Japan, Co., Ltd.

The neutralization solution to be used in the roughening process is preferably an acidic aqueous solution, and illustrative examples of the commercially available neutralization solution include "Reduction Solution Securiganth P" manufactured by Atotech Japan Co., Ltd.

Treatment with the neutralization solution can be carried out by soaking the surface treated with the roughening process by using the oxidant into the neutralization solution in the temperature range of 30 to 80° C. for the period of 5 to 30 minutes. In view of workability, it is preferable to soak the object treated with the roughening process by using the oxidant into the neutralization solution in the temperature range of 40 to 70° C. for the period of 5 to 20 minutes.

In the process (V), a conductive layer is formed; the conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or a metal alloy layer. Illustrative examples of the metal alloy layer include layers formed of metal alloys of two or more metals selected from the group mentioned above (for example, nickel-chromium alloy, copper-nickel alloy, and copper-titanium alloy). Among them, in view of general applicability to formation of the conductive layer, cost, easy patterning, and the like, preferable are single metal layers of chromium, nickel, titanium, aluminum, zinc, gold, palladium, silver, or copper; and metal alloy layers of a nickel-chromium alloy, a copper-nickel alloy, and a copper-titanium alloy. Among them, more preferable are single metal layers of chromium, nickel, titanium, aluminum, zinc, gold, palladium, silver, or copper, or a metal alloy layer of a nickel-chromium alloy. A single metal layer of copper is still more preferable.

The conductive layer may be of a single layer structure or of a multiple layer structure that includes two or more laminated single metal layers or metal alloy layers formed of different metals or metal alloys. In the case that the conductive layer is of the multiple layer structure, the layer contacting with the insulating layer is preferably a single metal layer of chromium, zinc, or titanium, or a metal alloy layer of a nickel-chromium alloy.

The thickness of the conductive layer is generally in the range of 3 to 35 μm, while preferably in the range of 5 to 30 μm, although these values depend on the intended design of the printed wiring board.

In one embodiment, the conductive layer may be formed by plating. For example, the conductive layer having an intended wiring pattern may be formed by plating on the surface of the insulating layer by a conventional heretofore known technology such as a semi-additive method, and a full additive method. In view of convenience in the production thereof, it is preferable to form the conductive layer by a semi-additive method. Hereinafter, an example will be described in which the conductive layer is formed by a semi-additive method.

First, a plated seed layer is formed onto the surface of the insulating layer by electroless plating. Next, onto the plated seed layer thus formed, a mask pattern is formed so as to expose part of the plated seed layer in accordance with an intended wiring pattern. After a metal layer is formed by electroplating onto the plated seed layer thus exposed, the mask pattern is removed. Thereafter, an unnecessary plated seed layer is removed by etching or the like, so that the conductive layer having the intended wiring pattern can be formed.

In an alternative embodiment, the conductive layer may be formed by using metal foil. In the case that the conductive layer is formed by using metal foil, it is preferable to carry out the process (V) between the process (I) and the process (II). For example, after the process (I), the supporting body is removed; and the metal foil is laminated on the surface of the resin composition layer thus exposed. Lamination of the metal foil with the resin composition layer may be carried out by a vacuum lamination method. The lamination conditions may be the same as those explained in the process (I). Next, the process (II) is carried out to form the insulating layer. Thereafter, by utilizing the metal foil on the insulating layer, the conductive layer having an intended wiring pattern can be formed by a conventional heretofore known technology such as a subtractive method, and a modified semi-additive method.

The metal foil can be produced by a heretofore known method such as an electrolysis method, and a rolling method. Illustrative examples of the metal foil that is commercially available include: HLP foil and JXUT-III foil, both being manufactured by JX Nippon Mining & Metals Corp.; and 3EC-III foil and TP-III foil, both being manufactured by Mitsui Mining & Smelting Co., Ltd.

Alternatively, when the metal foil or the metal foil attached with the supporting substrate is used as the supporting body in the resin sheet, the conductive layer may be formed by using this metal foil, as described before.

Also, the resin composition according to the present invention can be suitably used, at the time of production of a semiconductor chip package, as the resin composition to form the insulating layer for forming the redistribution layer (resin composition for forming redistribution layer) and as the resin composition to seal the semiconductor chip (resin composition for semiconductor chip sealing). The technology to produce the semiconductor chip package by using a resin composition (resin sheet) has been widely known in this field; the resin composition and resin sheet according to the present invention can be used in any method and technology.

Semiconductor Device

The semiconductor device according to the present invention includes the insulating layer formed of the cured product of the resin composition layer according to the present invention. The semiconductor device according to the present invention can be produced by using the printed wiring board or the semiconductor package according to the present invention. Thus, a method for producing a semiconductor device according to the present invention, comprises at least one step of forming at least one insulating layer of the semiconductor device by using the resin composition or the resin sheet as described above described above.

The semiconductor device may be various semiconductor devices to be supplied to electric products (for example, a computer, a mobile phone, a digital camera, and a television), vehicles (for example, a motor bike, an automobile, an electric train, a marine ship, and an airplane), and the like.

Other features of the invention will become apparent in the course of the following descriptions of exemplary embodiments which are given for illustration of the invention and are not intended to be limiting thereof.

EXAMPLES

It must be interpreted that the Examples and Comparative Examples are described that are common in the resin composition according to the first embodiment, in the resin composition according to the second embodiment, and in the resin composition according to the third embodiment. In the explanation below, "parts" and "%" that are used to express quantities mean "parts by mass" and "% by mass", respectively, unless otherwise specifically mentioned. The temperature condition and the pressure condition unless otherwise specifically mentioned are a room temperature (25° C.) and an atmospheric pressure (1 atm), respectively.

Synthesis Examples 1 to 3

Synthesis Example 1: Preparation of Varnish Containing Polyimide Resin ca

In 400 g of N,N-dimethylacetamide (hereinafter, this is also called "DMAc") as the solvent, 49.6 g of BPADA, 50.4 g of BPPAN, and 40 g of toluene as the solvent were mixed to obtain a monomer composition, which was then stirred to cause the reaction at normal temperature and an atmospheric pressure for 3 hours. With this, the polyamic acid solution was obtained.

Next, the polyamic acid solution was heated, and with keeping the temperature thereof at about 160° C., the condensed water was azeotropically removed with toluene under a nitrogen stream. It was confirmed that the prescribed amount of water was collected in a water measuring receiver and that water was not distilled out any more. After this was confirmed, the reaction solution was heated further to 200° C., at which temperature the solution was stirred for 1 hour, and then cooled. With this, the varnish containing 20% by mass of the polyimide resin (hereinafter, this is also called "polyimide resin ca") as the nonvolatile component was obtained.

From the above reaction path, the polyimide resin ca was presumed to include the structural unit represented by the following formula (c1a). Also, from the above reaction path, it was presumed that the polyimide resin ca included the first skeleton derived from BPADA and the second skeleton derived from BPPAN.

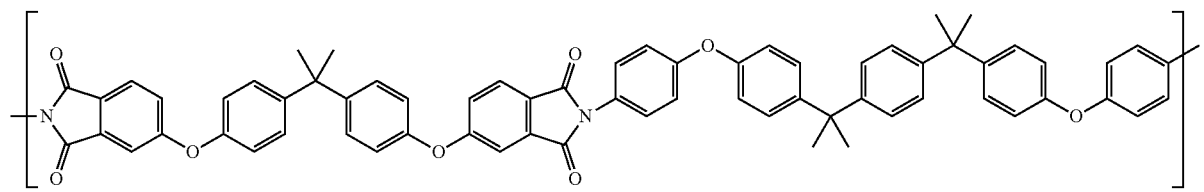

(c1a)

The glass transition temperature $Tg^{(C)}$ (° C.) of the polyimide resin ca measured by the before-described method was 210° C.

Synthesis Example 2: Preparation of Varnish Containing Polyimide Resin cb

The polyamic acid solution was obtained by the same method as Synthesis Example 1 except that in the monomer composition, the charge amount of 49.6 g of BPADA and the charge amount of 50.4 g of BPPAN in Synthesis Example 1 were changed to 53.3 g and 43.3 g, respectively, and that 3.5 g of isophoronediamine as the amine compound was mixed with the monomer composition. Then, from this polyamic acid solution, the varnish containing 20% by mass of the polyimide resin (hereinafter, this is also called "resin cb") as the nonvolatile component was obtained by the same way as Synthesis Example 1.

From the above reaction path, it was presumed that the polyimide resin cb included the structural unit represented by the formula (c1a), and that from the above reaction path, the resin cb further included the structural unit represented by the following formula (c1b) or the following formula (c1b'). Also, from the above reaction path, it was presumed that the polyimide resin cb included the first skeleton and the second skeleton, and from the above reaction path, further the third skeleton derived from isophoronediamine.

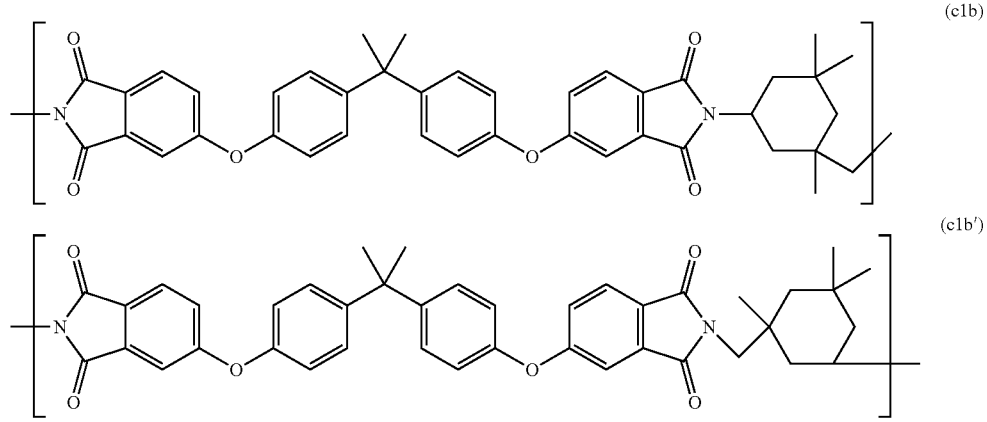

The glass transition temperature $Tg^{(C)}$ (° C.) of the polyimide resin cb measured by the before-described method was confirmed to be 140° C. or higher.

Synthesis Example 3: Preparation of Maleimide Resin e1a

The methyl ethyl ketone (MEK) solution of the maleimide resin e1a (nonvolatile content of 70% by mass) synthesized by the method of Synthesis Example 1 described in Journal of Technical Disclosure No. 2020-500211, published by Japan Institute of Invention and Innovation, was prepared. This maleimide resin e1a was the maleimide resin having the structure illustrated by the following formula (in the formula, $n_1$ represents the number of 0 or more), containing at least the maleimide compound having a trimethylindane skeleton ($n_1 \geq 1$).

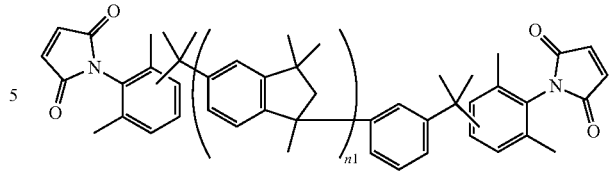

Examples 1 to 9 and Comparative Examples 1 to 4

Hereinafter, aspects of the resin compositions including the component (A) and the component (B), as well as the component selected from the component (C), the component (C'), and the component (C") (hereinafter, for the sake of convenience, these are collectively called "component (C)") will be described by Examples and Comparative Examples as the illustrative examples.

Example 1

(1) Preparation of Resin Varnish

As the component (A), 12 parts of the epoxy resin ("HP-4032-SS"; naphthalene type epoxy resin (1,6-bis(glycidyloxy)naphthalene); manufactured by DIC Corp.; epoxy equivalent of 144 g/eq.) was dissolved into 35 parts of solvent naphtha by heating with stirring; then, this solution was cooled to room temperature to obtain a mixed solution.

As the component (D), the inorganic filler d (spherical silica ("SO-C2"; manufactured by Admatechs Co., Ltd.; average particle diameter of 0.5 μm; specific surface area of 5.8 m²/g) whose surface was treated with an aminosilane type coupling agent ("KBM573" manufactured by Shin-Etsu Chemical Co., Ltd.)) was prepared. To the above-described mixed solution were added 2,115 parts of the inorganic filler d and 2 parts of the organic filler as the component (F) ("EXL-2655"; rubber particle; manufactured by Dow Chemical Co., Japan); then, the resulting mixture was uniformly dispersed by kneading with a triple roll mill to obtain the roll-dispersed product.

To this roll-dispersed solution were added 40 parts of the solution of the active ester compound b1a ("HPC-8000-65T"; manufactured by DIC Corp.; 223 g/eq. as the active group equivalent of the active ester compound; nonvolatile content of 65% by mass (toluene solution)) as the component (B-1), 2 parts of the epoxy curing agent ("LA-3018-

50P"; cresol novolak type curing agent containing a triazine skeleton; manufactured by DIC Corp.; functional group equivalent (hydroxy group equivalent) of 151 g/eq.; nonvolatile content of 50% by mass (2-methoxypropanol solution)) as the component (B-2), 7.5 parts of the varnish including the polyimide resin ca (nonvolatile content of 20% by mass) as the component (C), and 0.2 part of the curing facilitator or accelerator ("1B2PZ"; imidazole type curing facilitator (1-benzyl-2-phenylimidazole); manufactured by Shikoku Chemicals Corp.) as the component (G). Then, the resulting mixture was uniformly dispersed by using a high-speed rotation mixer to prepare the resin varnish (nonvolatile content of 157.7 parts by mass). The resin varnish thereby prepared is also called "resin varnish A".

(2) Preparation of Resin Sheet

The PET film having an alkyd resin type releasing layer ("AL5"; manufactured by Lintec Corp.; thickness of 38 μm) was prepared as the supporting body. Onto this releasing layer of the supporting body was uniformly applied the resin varnish A in such a way that the thickness of the resin composition layer after dried might become 40 μm. Then, this was dried for 5 minutes in the temperature range of 80 to 120° C. (average 100° C.) to obtain the resin sheet having the supporting body and the resin composition layer. The resin sheet thereby obtained is also called "resin sheet B".

(3) Assessments

Various measurements and assessments or evaluations in "Measurement Methods and Assessment Methods" to be described later were conducted by using the resin sheet B.

Examples 2 and 3

With the same method as Example 1 except for the following points, a respective resin varnish A and a respective resin sheet B were prepared, and then, assessments were carried out by using the resin sheet B thus prepared. Namely, in place of 40 parts of the solution of the active ester compound b1a as the component (B-1), 43 parts of the active ester compound b1b ("HPC-8150-62T" (active ester type curing agent including a naphthalene structure); manufactured by DIC Corp.; nonvolatile content of 62% by mass (toluene solution); 229 g/eq. as the active group equivalent of the active ester compound) was used in Example 2. 40 parts of the active ester compound b1c ("PC1300-02-65MA"; manufactured by Air Water Inc.; 200 g/eq. as the active group equivalent of the active ester compound; 1,400 g/eq. as the vinyl group equivalent; methyl amyl ketone solution with the nonvolatile content of 65% by mass) was used in Example 3.

Examples 4 to 8

In each Example, a resin varnish A was prepared similarly to Example 1 except for following points. In Example 4, 1 part of the maleimide resin e1a (nonvolatile content of 70% by mass) as the component (E-1a) was additionally mixed into the roll-dispersed product. In Example 5, 1 part of the maleimide resin e1b ("MIR-3000-70MT"; maleimide compound containing a biphenyl skeleton; manufactured by Nippon Kayaku Co., Ltd.; nonvolatile content of 70% by mass in MEK/toluene mixed solution) as the component (E-1a) was additionally mixed into the roll-dispersed product. In Example 6, 1 part of the maleimide resin e1c ("BMI-1500"; aliphatic maleimide compound; manufactured by Designer Molecules Inc.) as the component (E-1a) was additionally mixed into the roll-dispersed product. In Example 7, 1 part of the radically polymerizable compound e2a ("OPE-2St"; vinylbenzyl compound; manufactured by Mitsubishi Gas Chemical Co. Ltd.; number-average molecular weight of 1,200; nonvolatile content of 65% by mass in toluene solution) as the component (E-2a) was additionally mixed into the roll-dispersed product. In Example 8, 1 part of the radically polymerizable compound e2b ("ODV-XET-X04"; vinylbenzyl compound; manufactured by NIPPON STEEL Chemical & Material Co., Ltd.; nonvolatile content of 65% by mass in toluene solution) as the component (E-2a) was additionally mixed into the roll-dispersed product. With the same way as Example 1 except for the above-described points, a respective resin sheet B was prepared by using the resin varnish A, and the assessments thereof were conducted by using the resin sheet B thereby obtained.

Example 9

With the same method as Example 8, a resin varnish A was prepared, a resin sheet B was obtained, and the assessments were conducted by using the resin sheet B, except that in place of 7.5 parts of the varnish including the polyimide resin ca (nonvolatile content of 20% by mass) as the component (C), 7.5 parts of the varnish including the polyimide resin cb (nonvolatile content of 20% by mass) was used.

Comparative Examples 1 to 3

With the same method as respective Examples 1 to 3, in each of Comparative Examples 1 to 3, a respective resin varnish A and a respective resin sheet B were prepared, and the assessments were conducted by using the resin sheet B, except that in place of 7.5 parts of the varnish including the polyimide resin ca (nonvolatile content of 20% by mass) as the component (C), 5 parts of the phenoxy resin ("YX7553BH30"; manufactured by Mitsubishi Chemical Corp.; nonvolatile content of 30% by mass in the 1:1 MEK-cyclohexanone mixed solution) was used as the component (C'-1).

Comparative Example 4

With the same method as Example 3, a resin varnish A and a resin sheet B were prepared, and the assessments were conducted by using the resin sheet B, except that in place of 7.5 parts of the varnish including the polyimide resin ca (nonvolatile content of 20% by mass) as the component (C), 5 parts of the polyimide resin ("PIAD (registered trademark) 130" (polyimide resin containing an indane skeleton); manufactured by Arakawa Chemical Industries, Ltd.; nonvolatile content of 20% by mass in the cyclohexanone/methylcyclohexane mixed solution) was used as the component (C'-2).

Measurement Methods and Assessment Methods

Next, the measurement methods and the assessment methods will be explained.

Assessment of Dielectric Characteristics: Measurement of Dielectric Constant (Dk) and Dielectric Loss Tangent (Df)

The resin sheet B obtained in each of Examples and Comparative Examples was cured in an oven at 190° C. for 90 minutes, and then, this was taken out from the oven. By removing the supporting body from the resin sheet B, the cured product of the resin composition layer was obtained. This cured product was cut out to the length of 80 mm and the width of 2 mm to obtain the cured product for assessment.

The dielectric constant (Dk) and dielectric loss tangent value (Df value) of each cured product for assessment were measured by a resonant cavity perturbation method with the measurement frequency of 5.8 GHz and the measurement temperature of 23° C. by using "HP8362B", manufactured by Agilent Technologies, Inc. Measurement was done for two test pieces to calculate the average value of them.

Assessment of Heat Resistance; Measurement of Glass Transition Temperature (Tg)

Each of the resin sheets B obtained in Examples and Comparative Examples was cured by heating in an oven at 190° C. for 90 minutes; then, the cured film was obtained by being removed from the supporting body. The cured film thus obtained was cut out to the length of 20 mm and the width of 6 mm to obtain the assessment sample. The glass transition temperature (Tg) of the assessment sample was measured with the temperature ascending rate of 5° C./minute in the temperature range of 25 to 250° C. by using the Thermomechanical Analysis (TMA) instrument manufactured by Rigaku Corp. Measurement was done twice in the same test piece; then, the second value was recorded.

Assessment of Low Roughness; Measurement of Arithmetic Average Roughness (Ra)

(1) Preparation of Inner Layer Substrate

Both the surfaces of the dual copper clad laminate using a glass cloth substrate impregnated with an epoxy resin ("R1515A"; copper foil thickness of 18 μm; substrate thickness of 0.4 mm; manufactured by Panasonic Corp.) formed with an inner layer circuit were etched with a micro-etching agent ("CZ8101"; manufactured by MEC Co., Ltd.) with the etching amount of 1 μm to roughen the copper surfaces.

(2) Lamination of the Resin Sheet B

The resin sheets B were laminated on both the surfaces of the inner layer substrate by using a batch type vacuum press laminator ("CVP700"; two-stage build-up laminator; manufactured by Nikko Materials Co., Ltd.) such that the resin composition layers might contact with the inner layer substrate. The lamination was carried out such that after the pressure inside the laminator was reduced to 13 hPa or less by evacuation for 30 seconds, the resin sheets were press-adhered thereto with the pressure of 0.74 MPa at 120° C. for 30 seconds. Then, this was hot pressed with the pressure of 0.5 MPa at 100° C. for 60 seconds.

(3) Thermal Curing of the Resin Composition Layers

Next, the inner layer substrate laminated with the resin sheets B was heated in an oven at 130° C. for 30 minutes, and then this was transferred to another oven heated at 170° C., where the heating was continued for 30 minutes for thermal curing of the resin composition layer to form the insulating layers. Then, the supporting bodies were removed to obtain the cured substrate C having the insulating layer, the inner layer substrate, and the insulating layer in this order.

(4) Roughening Treatment

The cured substrate C was subjected to the desmear treatment as the roughening treatment. The desmear treatment was conducted by the wet desmear treatment as described below.

Wet Desmear Treatment

The cured substrate C was soaked in a swelling liquid ("Swelling Dip Securiganth P"; aqueous solution of diethyleneglycol monobutyl ether and sodium hydroxide; manufactured by Atotech Japan Co., Ltd.) at 60° C. for 5 minutes, and then, in an oxidant solution ("Concentrate Compact CP"; aqueous solution of about 6% concentration of potassium permanganate and about 4% concentration of sodium hydroxide; manufactured by Atotech Japan Co., Ltd.) at 80° C. for 20 minutes. Next, after this was soaked in a neutralization solution ("Reduction Solution Securiganth P"; sulfuric acid aqueous solution; manufactured by Atotech Japan Co., Ltd.) at 40° C. for 5 minutes, this was dried at 80° C. for 15 minutes.

(5) Measurement of Arithmetic Average Roughness (Ra) of the Insulating Layer Surface after Roughening Treatment The arithmetic average roughness (Ra) of the insulating layer surface of the cured substrate after the roughening treatment (this substrate is also called "cured substrate D") was measured by using a non-contact type surface roughness meter ("WYKO NT3300"; manufactured by Bruker Corp.) with the VSI mode, the 50 magnification lens, and the measurement range of 121 μm×92 μm. The value was obtained as the average value of 10 points.

Assessment of Conductor Adhesion; Measurement of Plating Peel Strength (1) Formation of Copper Conductive Layer By following the semi-additive method, the conductive layer was formed on the roughened surface of the insulating layer of the cured substrate D obtained in the assessment for the surface roughness. Namely, the cured substrate D was soaked in the electroless plating solution containing $PdCl_2$ at 40° C. for 5 minutes, and then in the electroless copper plating solution at 25° C. for 20 minutes. Next, after annealing by heating at 150° C. for 30 minutes, an etching resist was formed; then, a pattern was formed by etching. Then, the conductive layer with the thickness of 25 μm was formed by electroplating with copper sulfate, followed by annealing at 190° C. for 60 minutes. The substrate thus obtained is called "assessment substrate E".

(2) Measurement of Plating Peel Strength

The plating peel strength of the assessment substrate E was measured in accordance with the Japanese Industrial Standards (JIS C6481). Specifically, the conductive layer of the assessment substrate E was incised with the width of 10 mm and the length of 100 mm; then, one end of this portion was peeled off and held by a gripping tool, and this was peeled off to a vertical direction with the peeling speed of 50 mm/minute. The load (kgf/cm) at the peel of 35 mm was measured as the peel strength (plating peel strength). For the measurement, the tensile testing instrument ("AC-50C-SL"; manufactured by TSE Co., Ltd.) was used.

Assessment of Yield: Observation and Assessment of Irregularity of Insulating Layer Surface after Lamination and Cracks after Desmear 1. Observation of Irregularity of Cured Substrate The surface uniformity in the laminated portion with the resin sheets in both the surfaces of the cured substrate C (surface of the insulting layer in the opposite side of the laminated substrate) was visually observed. The assessment was done with the below standard, namely on the basis of whether or not the irregularity was observed only within 1 cm from the outer circumference of the laminated portion with the resin sheet and whether or not the portion inside thereof was a completely uniform surface.

No: Irregularity was observed only in the portion that was 1 cm inside from the outer circumference of the laminated portion with the resin sheet, and the portion inside of that portion was a completely uniform surface.

Yes: Irregular portion was observed in the portion that was inside of the portion of the portion 1 cm inside from the outer circumference of the portion laminated with the resin sheet.

2. Observation of the Cracks After Desmear (Roughening Treatment)

The cured substrate D was observed. Specifically, the cured substrate D was cleaned by water washing; and then, after water droplets were removed by air blowing, this was dried at 80° C. for 15 minutes to obtain a sample. With regard to the sample thereby obtained, the interlayer delamination between the copper layer and the insulating layer was visually observed. The recognition result was judged in accordance with the following standard.

None: There was no interlayer delamination recognized.
Presence: There was the interlayer delamination recognized.

3. Assessment of Yield

On the basis of the observation results of 1. Irregularity of Cured Substrate and 2. Cracks After Desmear, the yield after patterning was assessed in accordance with the following assessment standard.

Yield Assessment Standard:

O: Judgement was made that the observation result of the irregularity of the cured substrate was "No", and that the observation result of cracks of the cured substrate was "No".

X: Judgement was made that any one or both of the observation result of irregularity of the cured substrate and the observation result of cracks of the cured substrate were "Yes".

The results of Examples 1 to 9 are summarized in Table 1, and the results of Comparative Examples 1 to 4 are summarized in Table 2.

TABLE 1

| | | N.V. (%)*1 | Example 1 | Example 2 | Example 3 | Example 4 | Example 5 |
|---|---|---|---|---|---|---|---|
| Component (A) | HP-4032-SS | 100 | 12 | 12 | 12 | 12 | 12 |
| Component (B-1) | HPC-8000-65T | 65 | 40 | — | — | 1 | — |
| | HPC-8150-62T | 62 | — | 43 | — | — | — |
| | PC1300-02-65MA | 65 | — | 1 | 40 | 40 | 40 |
| Component (B-2) | LA-3018-50P | 50 | 2 | 2 | 2 | 2 | 2 |
| Component (C) | Polyimide resin ca | 20 | 7.5 | 7.5 | 7.5 | 7.5 | 7.5 |
| | Polyimide resin cb | 20 | — | — | — | — | — |
| Component (C'-1) | YX7553BH30 | 30 | — | — | — | — | — |
| Component (C'-2) | PIAD130 | 20 | — | — | — | — | — |
| Component (D) | SO-C2 | 100 | 115 | 115 | 115 | 115 | 115 |
| Component (E-1) | Maleimide resin e1a | 70 | — | — | — | 1 | — |
| | MIR-3000-70MT | 70 | — | — | — | — | 1 |
| | BMI-1500 | 100 | — | — | — | — | — |
| Component (E-2) | OPE-2St | 65 | — | — | — | — | — |
| | ODV-XET-X04 | 65 | — | — | — | — | — |
| Component (F) | EXL-2655 | 100 | 2 | 2 | 2 | 2 | 2 |
| Component (G) | 1B2PZ | 100 | 0.2 | 0.2 | 0.2 | 0.2 | 0.2 |
| Content of nonvolatile components (parts by mass) | | | 157.7 | 158.4 | 157.7 | 158.4 | 158.4 |
| Content of component (C) (mass %)*2 | | | 0.95 | 0.95 | 0.95 | 0.95 | 0.95 |
| Content of component (D) (mass %)*2 | | | 72.9 | 72.6 | 72.9 | 72.6 | 72.6 |
| Assessment of yield | Irregularity after lamination | | None | None | None | None | None |
| | Cracks after desmear | | None | None | None | None | None |
| | Result | | ○ | ○ | ○ | ○ | ○ |
| Dielectric characteristics | Dk | | 3.3 | 3.3 | 3.3 | 3.3 | 3.3 |
| | Df | | 0.0019 | 0.0019 | 0.0019 | 0.0018 | 0.0018 |
| Heat resistance | Tg (° C.)*3 | | 150 | 150 | 155 | 155 | 155 |
| Plating adhesion | Peel strength (kgf/cm) | | 0.45 | 0.45 | 0.45 | 0.45 | 0.45 |
| Low roughness | Ra (nm) | | 50 | 50 | 50 | 50 | 50 |

| | | N.V. (%)*1 | Example 6 | Example 7 | Example 8 | Example 9 |
|---|---|---|---|---|---|---|
| Component (A) | HP-4032-SS | 100 | 12 | 12 | 12 | 12 |
| Component (B-1) | HPC-8000-65T | 65 | — | — | — | — |
| | HPC-8150-62T | 62 | — | — | — | — |
| | PC1300-02-65MA | 65 | 40 | 40 | 40 | 40 |
| Component (B-2) | LA-3018-50P | 50 | 2 | 2 | 2 | 2 |
| Component (C) | Polyimide resin ca | 20 | 7.5 | 7.5 | 7.5 | — |
| | Polyimide resin cb | 20 | — | — | — | 7.5 |
| Component (C'-1) | YX7553BH30 | 30 | — | — | — | — |
| Component (C'-2) | PIAD130 | 20 | — | — | — | — |
| Component (D) | SO-C2 | 100 | 115 | 115 | 115 | 115 |
| Component (E-1) | Maleimide resin e1a | 70 | — | — | — | — |
| | MIR-3000-70MT | 70 | — | 1 | — | — |
| | BMI-1500 | 100 | 1 | — | — | — |
| Component (E-2) | OPE-2St | 65 | — | 1 | — | — |
| | ODV-XET-X04 | 65 | — | — | 1 | 1 |
| Component (F) | EXL-2655 | 100 | 2 | 2 | 2 | 2 |
| Component (G) | 1B2PZ | 100 | 0.2 | 0.2 | 0.2 | 0.2 |
| Content of nonvolatile components (parts by mass) | | | 158.7 | 158.4 | 158.4 | 158.4 |
| Content of component (C) (mass %)*2 | | | 0.95 | 0.95 | 0.95 | 0.95 |
| Content of component (D) (mass %)*2 | | | 72.5 | 72.6 | 72.6 | 72.6 |
| Assessment of yield | Irregularity after lamination | | None | None | None | None |
| | Cracks after desmear | | None | None | None | None |
| | Result | | ○ | ○ | ○ | ○ |
| Dielectric characteristics | Dk | | 3.3 | 3.3 | 3.3 | 3.3 |
| | Df | | 0.0018 | 0.0018 | 0.0018 | 0.0018 |
| Heat resistance | Tg (° C.)*3 | | 145 | 155 | 155 | 155 |

TABLE 1-continued

| | | | | | |
|---|---|---|---|---|---|
| Plating adhesion | Peel strength (kgf/cm) | 0.45 | 0.45 | 0.45 | 0.45 |
| Low roughness | Ra (nm) | 50 | 50 | 50 | 50 |

*¹Content ratio of nonvolatile components in resin composition
*²Value relative to 100% by mass of nonvolatile components in resin composition
*³By TMA method

TABLE 2

| | | N.V. (%) *¹ | Comparative Example 1 | Comparative Example 2 | Comparative Example 3 | Comparative Example 4 |
|---|---|---|---|---|---|---|
| Component (A) | HP-4032-SS | 100 | 12 | 12 | 12 | 12 |
| Component (B-1) | HPC-8000-65T | 65 | 40 | — | — | — |
| | HPC-8150-62T | 62 | — | 43 | — | — |
| | PC1300-02-65MA | 65 | — | — | 40 | 40 |
| Component (B-2) | LA-3018-50P | 50 | 2 | 2 | 2 | 2 |
| Component (C) | Polyimide resin ca | 20 | — | — | — | — |
| | Polyimide resin cb | 20 | — | — | — | — |
| Component (C'-1) | YX7553BH30 | 30 | 5 | 5 | 5 | — |
| Component (C'-2) | PIAD130 | 20 | — | — | — | 5 |
| Component (D) | SO-C2 | 100 | 115 | 115 | 115 | 115 |
| Component (E-1) | Maleimide resin e1a | 70 | — | — | — | — |
| | MIR-3000-70MT | 70 | — | — | — | — |
| | BMI-1500 | 100 | — | — | — | — |
| Component (E-2) | OPE-2St | 65 | — | — | — | — |
| | ODV-XET-X04 | 65 | — | — | — | — |
| Component (F) | EXL-2655 | 100 | 2 | 2 | 2 | 2 |
| Component (G) | 1B2PZ | 100 | 0.2 | 0.2 | 0.2 | 0.2 |
| | Content of nonvolatile components (parts by mass) | | 157.7 | 158.4 | 157.7 | 157.7 |
| | Content of component (C) (mass %) *² | | 0.00 | 0.00 | 0.00 | 0.95 |
| | Content of component (D) (mass %) *² | | 72.9 | 72.6 | 72.9 | 72.9 |
| Assessment of yield | Irregularity after lamination | | Presence | Presence | Presence | Presence |
| | Cracks after desmear | | Presence | Presence | Presence | Presence |
| | Result | | x | x | x | x |
| Dielectric characteristics | Dk | | 3.3 | 3.3 | 3.3 | 3.3 |
| | Df | | 0.0044 | 0.0049 | 0.0033 | 0.0027 |
| Heat resistance | Tg (° C.) *³ | | 150 | 150 | 155 | 110 |
| Plating adhesion | Peel strength (kgf/cm) | | 0.45 | 0.45 | 0.45 | 0.45 |
| Low roughness | Ra (nm) | | 50 | 50 | 50 | 50 |

*¹ Content ratio of nonvolatile components in resin composition
*² Value relative to 100% by mass of nonvolatile components in resin composition
*³ By TMA method Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

What is claimed is:

1. A resin composition, comprising:

(A) at least one epoxy resin;

(B) at least one epoxy curing agent; and (C) at least one polyinide resin comprising a structural unit represented by formula (c1):

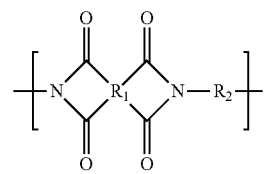

wherein in formula (c1),
R₁ represents a tetravalent group represented by the following formula (c1-1), and
R₂ represents a divalent group represented by the following formula (c1-2):

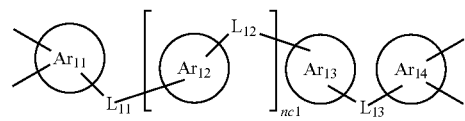

wherein in formula (c1-1),
$Ar_{11}$, $Ar_{12}$, $Ar_{13}$, and $Ar_{14}$ each independently represent an optionally substituted aromatic ring, $L_{11}$, $L_{12}$, and $L_{13}$ each independently represent a divalent connecting group, and nc1 represents an integer of 0 or more;

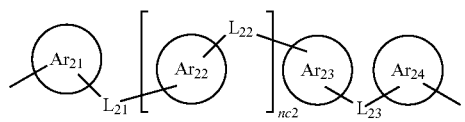
(c1-2)

wherein in formula (c1-2), $Ar_{21}$, $Ar_{22}$, $Ar_{23}$, and $Ar_{24}$ each independently represent an optionally substituted aromatic ring, $L_{21}$, $L_{22}$, and $L_{23}$ each independently represent a divalent connecting group, and nc2 represents an integer of 1 or more, wherein said component (B) comprises (B-1) an active ester compound, which is obtained from a carboxylic acid compound and a phenol compound and/or a naphthol compound.

2. The resin composition according to claim 1, wherein in formula (c1-1), $Ar_{11}$, $Ar_{12}$, $Ar_{13}$, and $Ar_{14}$ each independently represent an optionally substituted aromatic carbon ring having 6 to 14 carbon atoms, and in formula (c1-2), $Ar_{21}$, $Ar_{22}$, $Ar_{23}$, and $Ar_{24}$ each independently represent an optionally substituted aromatic carbon ring having 6 to 14 carbon atoms.

3. The resin composition according to claim 1, wherein in formula (c1-1), $L_{11}$, and $L_{13}$ represent —O—, and $L_{12}$ represents an optionally substituted alkylene group, and in the formula (c1-2), $L_{21}$ and $L_{23}$ represent —O—, and $L_{22}$ represents an optionally substituted alkylene group.

4. The resin composition according to claim 1, wherein said component (C) is a resin further comprising a structural unit represented by the following formula (c2):

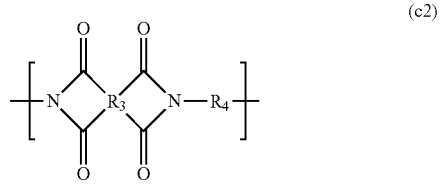
(c2)

wherein in formula (c2), $R_3$ represents an optionally substituted tetravalent aliphatic group or an optionally substituted tetravalent aromatic group, and $R_4$ represents an optionally substituted divalent aliphatic group or an optionally substituted divalent aromatic group; when $R_3$ is same as $R_1$, $R_4$ is different from $R_2$, and when $R_4$ is same as $R_2$, $R_3$ is different from $R_1$.

5. The resin composition according to claim 4, wherein $R_4$ is an optionally substituted divalent aliphatic group, the divalent aliphatic group being obtainable from isophoronediamine by removal of two amino groups thereof.

6. The resin composition according to claim 4, wherein $R_3$ is same as $R_1$.

7. The resin composition according to claim 4, wherein $R_4$ is an optionally substituted divalent aliphatic group, and one of the substituent groups thereof is an alkyl group having 1 to 6 carbon atoms.

8. The resin composition according to claim 1, wherein said component (C) is present in an amount of 0.01 to 30% by mass relative to 100% by mass of nonvolatile components in said resin composition.

9. The resin composition according to claim 1, further comprising (D) an inorganic filler.

10. The resin composition according to claim 9, wherein said component (D) is present in an amount of 40% or more by mass relative to 100% by mass of nonvolatile components in said resin composition.

11. The resin composition according to claim 1, wherein a cured product thereof has a glass transition temperature of 140° C. or higher.

12. The resin composition according to claim 1, wherein a cured product thereof has a dielectric loss tangent of less than 0.003.

13. The resin composition according to claim 1, wherein a cured product thereof has a dielectric constant of 3.0 or more.

14. A cured product of a resin composition according to claim 1.

15. A sheet lamination material, comprising a resin composition according to claim 1.

16. A resin sheet comprising:
a supporting body; and
a resin composition layer formed on said supporting body, said resin composition layer being formed of a resin composition according to claim 1.

17. A printed wiring board, comprising an insulating layer formed of a cured product of a resin composition according to claim 1.

18. A semiconductor device, comprising a printed wiring board according to claim 17.

19. A method for producing a printed wiring board, comprising a step of forming an insulating layer of the printed wiring board by using a resin composition according to claim 1.

20. The resin composition according to claim 1, wherein in formula (c1-2), nc2 represents an integer of 2 or more.

21. The resin composition according to claim 1, wherein said component (B) comprises (B-1) an active ester compound which is an ester of a phenol compound and/or a naphthol compound selected from the group consisting of hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxy naphthalene, 1,6-dihydroxy naphthalene, 2,6-dihydroxy naphthalene, dihydroxy benzophenone, trihydroxy benzophenone, tetrahydroxy benzophenone, phloroglucin, benzene triol, a dicyclopentadiene type diphenol compound, and phenol novolak.

22. The resin composition according to claim 1, wherein said component (B) comprises (B-1) an active ester compound which is an ester of a carboxylic acid compound selected from the group consisting of benzoic acid, acetic acid, succinic acid, maleic acid, itaconic acid, phthalic acid, isophthalic acid, terephthalic acid, and pyromellitic acid.

23. A resin composition, comprising:
(A) at least one epoxy resin;
(B) at least one epoxy curing agent; and
(C') at least one polyimide resin, wherein
said component (C') is a resin comprising a first skeleton derived from 2,2-bis[4-(3,4-dicarboxyphenoxy)phenyl] propane dianhydride and a second skeleton derived from 4,4'-[1,4-phenylenebis[(1-methylethylidene)-4,1-phenyleneoxy]]bisbenzeneamine, wherein said component (B) comprises (B-1) an active ester compound, which is obtained from a carboxylic acid compound and a phenol compound and/or a naphthol compound.

24. The resin composition according to claim 23, wherein said component (C') is a resin further comprising a third skeleton that is different from the second skeleton, and the third skeleton is a skeleton derived from one or more diamine compounds selected from the group consisting of diamine compounds having an optionally substituted aliphatic group and diamine compounds having an optionally substituted aromatic group.

25. The resin composition according to claim 24, wherein the third skeleton is a skeleton derived from a diamine compound having an aliphatic group having, as a substituent group thereof, an alkyl group having 1 to 6 carbon atoms.

26. The resin composition according to claim 23, wherein said component (C') is a resin further comprising a skeleton derived from isophoronediamine.

27. The resin composition according to claim 23, wherein said component (C') is present in an amount of 0.01 to 30% by mass relative to 100% by mass of nonvolatile components in said resin composition.

28. A resin composition, comprising:
(A) at least one epoxy resin;
(B) at least one epoxy curing agent; and
(C") at least one polyimide resin, wherein
said component (C") is a resin obtained by polymerizing and imidizing a monomer composition comprising at least 2,2-bis[4-(3,4-dicarboxyphenoxy)phenyl]propane dianhydride and 4,4'-[1,4-phenylenebis[(1-methylethylidene)-4,1-phenyleneoxy]]bisbenzeneamine,
wherein said component (B) comprises (B-1) an active ester compound, which is obtained from a carboxylic acid compound and a phenol compound and/or a naphthol compound.

29. The resin composition according to claim 28, wherein said monomer composition further comprises one or more diamine compounds selected from the group consisting of diamine compounds having an optionally substituted aliphatic group and diamine compounds having an optionally substituted aromatic group.

30. The resin composition according to claim 28, wherein said monomer composition further comprises a diamine compound having an aliphatic group having, as a substituent group thereof, an alkyl group having 1 to 6 carbon atoms.

31. The resin composition according to claim 28, wherein said monomer composition further comprises isophoronediamine.

32. The resin composition according to claim 28, wherein said component (C") is present in an amount of 0.01 to 30% by mass relative to 100% by mass of nonvolatile components in said resin composition.

* * * * *